(12) United States Patent
Park et al.

(10) Patent No.: US 12,002,514 B2
(45) Date of Patent: Jun. 4, 2024

(54) NONVOLATILE MEMORY AND STORAGE DEVICE INCLUDING SAME

(71) Applicant: SAMSUNG ELECTRONICS CO., LTD., Suwon-si (KR)

(72) Inventors: Sang-Won Park, Seoul (KR); Won-Taeck Jung, Hwaseong-si (KR); Han-Jun Lee, Seoul (KR); Su Chang Jeon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 253 days.

(21) Appl. No.: 17/706,097

(22) Filed: Mar. 28, 2022

(65) Prior Publication Data

US 2023/0145750 A1    May 11, 2023

(30) Foreign Application Priority Data

Nov. 8, 2021   (KR) .................. 10-2021-0152265

(51) Int. Cl.
  *G11C 8/12*   (2006.01)
  *G11C 16/04*  (2006.01)
  *G11C 16/10*  (2006.01)
  *G11C 16/34*  (2006.01)
(52) U.S. Cl.
  CPC .......... *G11C 16/10* (2013.01); *G11C 16/0483* (2013.01); *G11C 16/3459* (2013.01); *G11C 8/12* (2013.01)

(58) Field of Classification Search
  CPC ........................................... G11C 8/12
  See application file for complete search history.

(56) References Cited

U.S. PATENT DOCUMENTS

| | | | |
|---|---|---|---|
| 8,654,585 B2 | 2/2014 | Oh et al. | |
| 8,854,884 B2 * | 10/2014 | Kim ................. | G11C 16/10 365/185.11 |
| 8,861,282 B2 | 10/2014 | Dutta et al. | |
| 8,988,941 B2 | 3/2015 | Avila et al. | |
| 9,076,683 B2 | 7/2015 | Nam et al. | |
| 10,573,388 B2 | 2/2020 | Gupta et al. | |
| 10,593,691 B2 | 3/2020 | Umezawa et al. | |
| 2020/0202947 A1 | 6/2020 | Kim et al. | |

* cited by examiner

*Primary Examiner* — Jason Lappas
(74) *Attorney, Agent, or Firm* — Fish & Richardson P.C.

(57) ABSTRACT

A nonvolatile memory may include; a first memory cell array including a first selection transistor connected to a first string selection line, a second memory cell array including a second selection transistor connected to a second string selection line and spaced apart from the first string selection line by a first cutting line, and a peripheral circuit. The peripheral circuit may provide a first program voltage to the first selection transistor, provide a second program voltage to the second selection transistor different from the first program voltage, program the first selection transistor with a first threshold voltage in response to the first program voltage, and program the second selection transistor with a second threshold voltage level greater than the first threshold voltage in response to the second program voltage.

20 Claims, 24 Drawing Sheets

NONVOLATILE MEMORY AND STORAGE DEVICE INCLUDING SAME

CROSS-REFERENCE TO RELATED APPLICATION

This application claims priority under 35 U.S.C. 119 from Korean Patent Application No. 10-2021-0152265 filed on Nov. 8, 2021 in the Korean Intellectual Property Office, the subject matter of which is hereby incorporated by reference in its entirety.

BACKGROUND

Technical Field

The inventive concept relates generally to nonvolatile memories and storage devices including same.

Description of the Related Art

Semiconductor memory devices include volatile memory devices and nonvolatile memory devices. Data access speeds for volatile memory devices are generally faster, but volatile memory devices lose stored data in the absence of applied power. In contrast, nonvolatile memory devices maintain stored data even in the absence of applied power.

Volatile memory devices include, for example, static random access memory (RAM) (SRAM), dynamic RAM (DRAM) and synchronous DRAM (SDRAM). Nonvolatile memory devices include, for example, read only memory (ROM), programmable ROM (PROM), electrically programmable ROM (EPROM), electrically erasable and programmable ROM (EEPROM), flash memory, phase change RAM (PRAM), magnetic RAM (MRAM), resistive RAM (RRAM), and ferroelectric RAM (FeRAM). Here, flash memory may include NOR-type flash memory and NAND-type flash memory.

A recently developed NAND-type flash memory is characterized by a high stack structure and a large number of channel holes. However, as the number of channel structures included in a nonvolatile memory device increases, problems may arise in the operation of the nonvolatile memory device.

SUMMARY

Embodiments of the inventive concept provide nonvolatile memories exhibiting improved performance and reliability. Embodiments of the inventive concept also provide storage devices including such nonvolatile memories.

According to an embodiment of the inventive concept, a nonvolatile memory may include; a first memory cell array including a first selection transistor connected to a first string selection line, a second memory cell array including a second selection transistor connected to a second string selection line and spaced apart from the first string selection line by a first cutting line; and a peripheral circuit configured, wherein the peripheral circuit is configured to provide a first program voltage to the first selection transistor, provide a second program voltage to the second selection transistor different from the first program voltage, program the first selection transistor with a first threshold voltage in response to the first program voltage, and program the second selection transistor with a second threshold voltage level greater than the first threshold voltage in response to the second program voltage.

According to an embodiment of the inventive concept, a nonvolatile memory may include; a substrate including a first string selection line and a second string selection line spaced apart from the first string selection line by a first cutting line, a first word line cutting area in the substrate and extending in a first direction, first channel structure passing through the first string selection line, and a second channel structure passing through the second string selection line, wherein the first string selection line is spaced apart in a second direction from the first word line cutting area by a first distance, the second string selection line is spaced apart in the second direction from the first word line cutting area by a second distance greater than the first distance, and a first threshold voltage of the first string selection line is different from a second threshold voltage of the second string selection line.

According to an embodiment of the inventive concept, a storage device may include; a controller, and nonvolatile memory controlled by the controller, wherein the nonvolatile memory includes a first memory block including a first selection transistor connected to a first string selection line and a second memory block including a second selection transistor connected to a second string selection line and spaced apart from the first string selection line by a first cutting line, the controller is configured to provide a first program command and a second program command different from the first program command to the nonvolatile memory, the nonvolatile memory is configured to program the first selection transistor with a first threshold voltage in response to the first program command, and program the second selection transistor with a second threshold voltage different from the first threshold voltage in response to the second program command, the controller is further configured to provide a first read command and a second read command different from the first read command to the nonvolatile memory, and the nonvolatile memory is further configured to read first data using a first string selection voltage greater than the first threshold voltage in response to the first read command, and read second data using a second string selection voltage greater than the second threshold voltage in response to the second read command.

BRIEF DESCRIPTION OF DRAWINGS

Advantages, benefits, objects, feature and related aspects of the inventive concept will become more apparent upon consideration of the following detailed description together with the accompanying drawings, in which.

DETAILED DESCRIPTION

Throughout the written description and drawings, like reference numbers and labels are used to denote like or similar elements, components, features and/or method steps.

Figure 1:
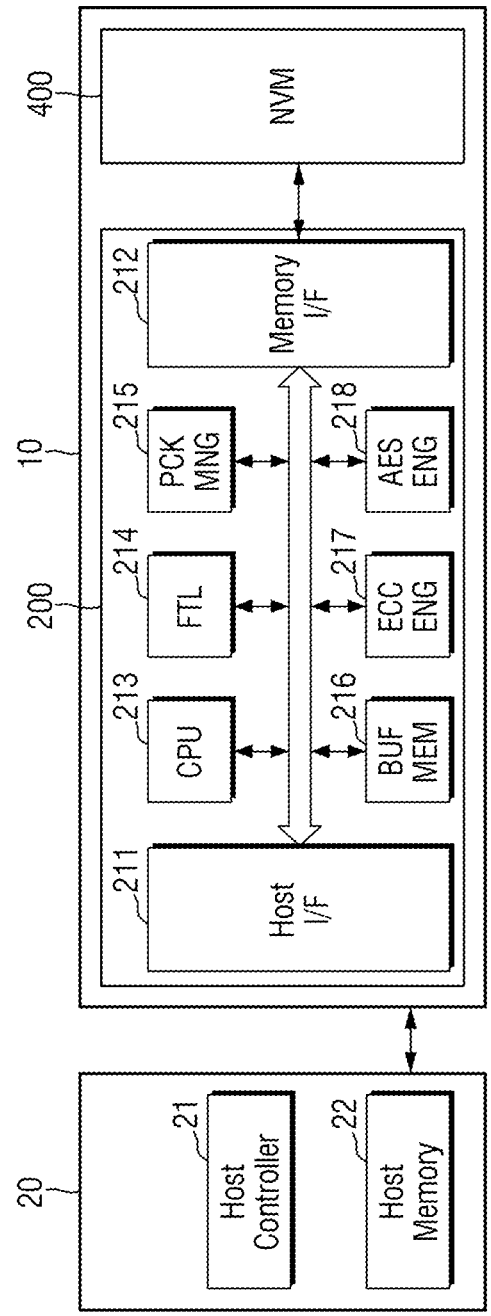
FIG. 1 is a block diagram illustrating a memory system according to embodiments of the inventive concept.

FIG. 1 is a block diagram illustrating a memory system 1 according to embodiments of the inventive concept.

Referring to FIG. 1, the memory system 1 may generally include a host device 20 and a storage device 10. The host device 20 may include a host controller 21 and a host memory 22. The host controller 21 may control an overall operation of the host device 20. The host memory 22 may temporarily store data transmitted from the outside, data to be transmitted to the storage device 10, or data transmitted from the storage device 10. The host device 20 may be implemented as an application processor (AP), but the embodiments of the inventive concept are not limited thereto.

The storage device 10 may include a storage controller 200 and a nonvolatile memory 400.

The storage device 10 may include storage media capable of storing data in response to request(s) from the host device 20. As an example, the storage device 10 may include at least one of a solid state drive (SSD), an embedded memory, or a detachable external memory. Assuming the storage device 10 is a SSD, the storage device 10 may be configured to comply with well-understood and commercially available technical standard(s) associated with non-volatile memory express (NVMe). Assuming that the storage device 20 is an embedded memory or the external memory, the storage device 10 may be configured to comply with well-understood and commercially available technical standard(s) associated with universal flash storage (UFS) and/or embedded multi-media card (eMMC). Each of the host device 20 and the storage device 10 may be configured to generate and communicate (e.g., transmit and/or receive) packets defined in accordance with one or more communication protocols.

Where the nonvolatile memory 400 of the storage device 10 includes flash memory, the flash memory may include a two-dimensional (2D) NAND memory array and/or a three-dimensional (3D or vertical) NAND (VNAND) memory array. Alternately or additionally, the storage device 10 may include MRAM, spin-transfer torque MRAM, Conductive Bridging RAM (CBRAM), FeRAM, PRAM and/or RRAM.

The storage controller 200 may include a host interface 211, a memory interface 212 and a central processing unit (CPU) 213. The storage controller 200 may further include a flash translation layer (FTL) 214, a packet manager 215, a buffer memory 216, an error correction code (ECC) engine 217 and an encryption standard engine 218. The storage controller 200 may further include a working memory (not shown) into which the flash translation layer (FTL) 214 is loaded, and the CPU 213 may control data write and read operations for the nonvolatile memory 400 by executing the flash translation layer.

The host interface 211 may communicate packets with the host device 20. The packet transmitted from the host device 20 to the host interface 211 may include a command or data to be written in the nonvolatile memory 400, and the packet transmitted from the host interface 211 to the host device 20 may include a response to the command or data read from the nonvolatile memory 400. The memory interface 212 may transmit the data to be written in the nonvolatile memory 400 to the nonvolatile memory 400 or may receive the data read from the nonvolatile memory 400. Such a memory interface 212 may be configured to comply with one or more technical standard(s), such as Toggle or Open NAND Flash Interface (ONFI).

The flash translation layer 214 may perform various functions such as address mapping, wear-leveling and garbage collection. The address mapping operation is an operation of changing a logical address received from the host device 20 to a physical address used to actually store data in the nonvolatile memory 400. For example, the storage controller 200 may generate a matching table that includes a physical block address corresponding to a logical block address. The wear-leveling is an operating approach that prevents excessive degradation of a specific block by allowing blocks in the nonvolatile memory 400 to be used uniformly, and may exemplarily be implemented through firmware technology for balancing erase counts of physical blocks. The garbage collection is a technique for making sure of the available capacity in the nonvolatile memory 400 by copying valid data of a block to a new block and then erasing the existing block.

The packet manager 215 may generate a packet according to a protocol of an interface negotiated with the host device 20, or may parse various kinds of information from the packet received from the host device 20.

The buffer memory 216 may temporarily store data to be written in the nonvolatile memory 400 or data to be read from the nonvolatile memory 400. The buffer memory 216 may be provided in the storage controller 200, but may be disposed outside the storage controller 200.

The ECC engine 217 may perform error detection and correction functions for the data read from the nonvolatile memory 400. That is, the ECC engine 217 may generate parity bits for write data to be written in the nonvolatile memory 400, and the generated parity bits may be stored in the nonvolatile memory 400 together with the write data.

When reading the data from the nonvolatile memory 400, the ECC engine 217 may correct an error of the read data using the parity bits read from the nonvolatile memory 400 together with the read data, and then may output the error-corrected read data.

The AES engine 218 may perform at least one of an encryption operation ad/or a decryption operation for data input to the storage controller 200 using a symmetric-key algorithm.

Figure 2:
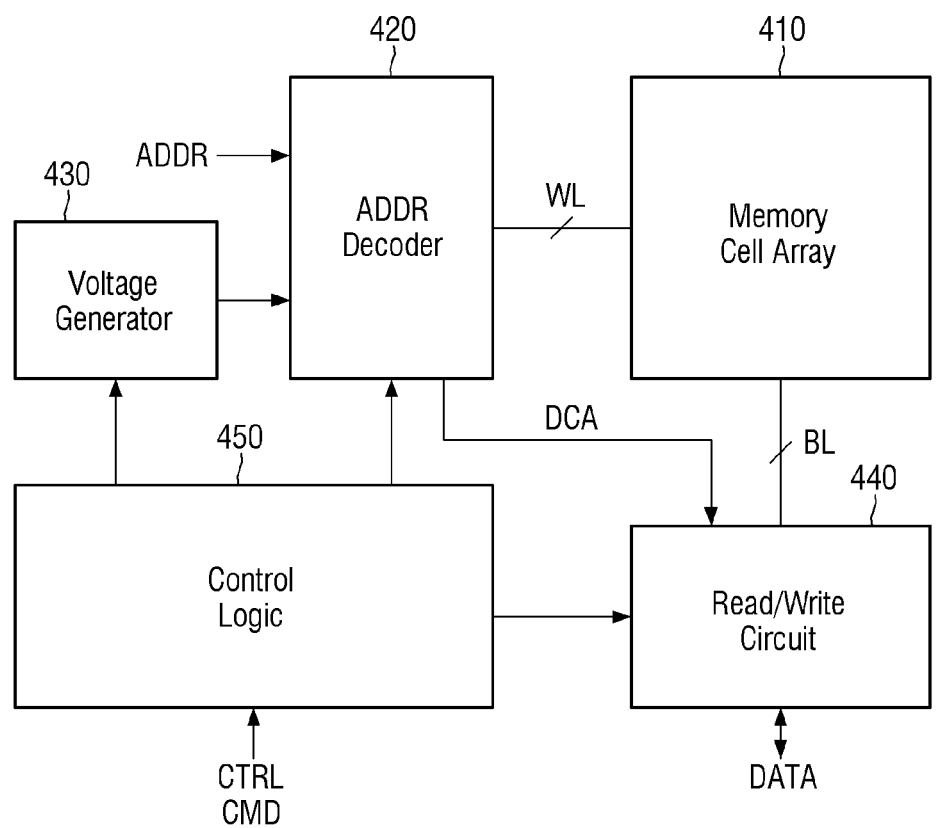
FIG. 2 is a block diagram further illustrating the nonvolatile memory 400 of FIG. 1.

FIG. 2 is a block diagram further illustrating the nonvolatile memory 400 of FIG. 1.

Referring to FIG. 2, the nonvolatile memory 400 may include a memory cell array 410, an address decoder 420, a voltage generator 430, a read write circuit 440, and a control logic circuit 450. In this case, the address decoder 420, the voltage generator 430, the read write circuit 440 and the control logic circuit 450 other than the memory cell array 410 may correspond to peripheral circuits.

The memory cell array 410 may be connected to the address decoder 420 through word lines WL. The memory cell array 410 may be connected to the read write circuit 440 through bit lines BL. The memory cell array 410 may include a plurality of memory cells. For example, memory cells arranged in a row direction may be connected to a word line WL. For example, memory cells arranged in a column direction may be connected to a bit line BL.

The address decoder 420 may be connected to the memory cell array 410 through the word line WL. The address decoder 420 may operate in response to the control of the control logic circuit 450. The address decoder 420 may be supplied with an address ADDR from the storage controller 200. The address decoder 420 may be supplied with a voltage required for an operation such as a program operation and a read operation from the voltage generator 430.

The address decoder 420 may decode a row address of the received address ADDR. The address decoder 420 may select the word line WL using the decoded row address. A decoded column address DCA may be provided to the read write circuit 440. For example, the address decoder 420 may include a row decoder, a column decoder, and an address buffer.

The voltage generator 430 may generate a voltage required for an access operation under the control of the control logic circuit 450. For example, the voltage generator 430 may generate a program voltage and a program verification voltage, which are required to perform a program operation. For example, the voltage generator 430 may generate read voltages required to perform a read operation, and may generate an erase voltage and an erase verification voltage, which are required to perform an erase operation. For example, the voltage generator 430 may generate a monitoring voltage for monitoring data stored in the memory cell array 410. Also, the voltage generator 430 may provide a voltage required for each operation to the address decoder 420. In some embodiments, the voltage generator 430 may provide a voltage for programming the threshold voltage of the memory cell array 410 to the address decoder 420.

The read write circuit 440 may be connected to the memory cell array 410 through the bit line BL. The read write circuit 440 may communicate data DATA with the storage controller 200. The read write circuit 440 may operate in response to the control of the control logic circuit 450. The read write circuit 440 may be supplied with the decoded column address DCA decoded from the address decoder 420. The read write circuit 440 may select the bit line BL using the decoded column address DCA.

For example, the read write circuit 440 may program the received data DATA into the memory cell array 410. The read write circuit 440 may read the data from the memory cell array 410 and provide the read data to the outside (e.g., storage controller 200). For example, the read write circuit 440 may include a sensing amplifier, a write driver, a column selection circuit, and a page buffer. That is, the read write circuit 440 may buffer the data DATA received from the storage controller 200 in the page buffer and program the buffered data DATA into the memory cell array 410.

The control logic circuit 450 may be connected to the address decoder 420, the voltage generator 430, and the read write circuit 440. The control logic circuit 450 may control the operation of the nonvolatile memory 400. The control logic circuit 450 may operate in response to a control signal CRTL and a command CMD (e.g., write command and read command), which are provided from the storage controller 200.

Figure 3:
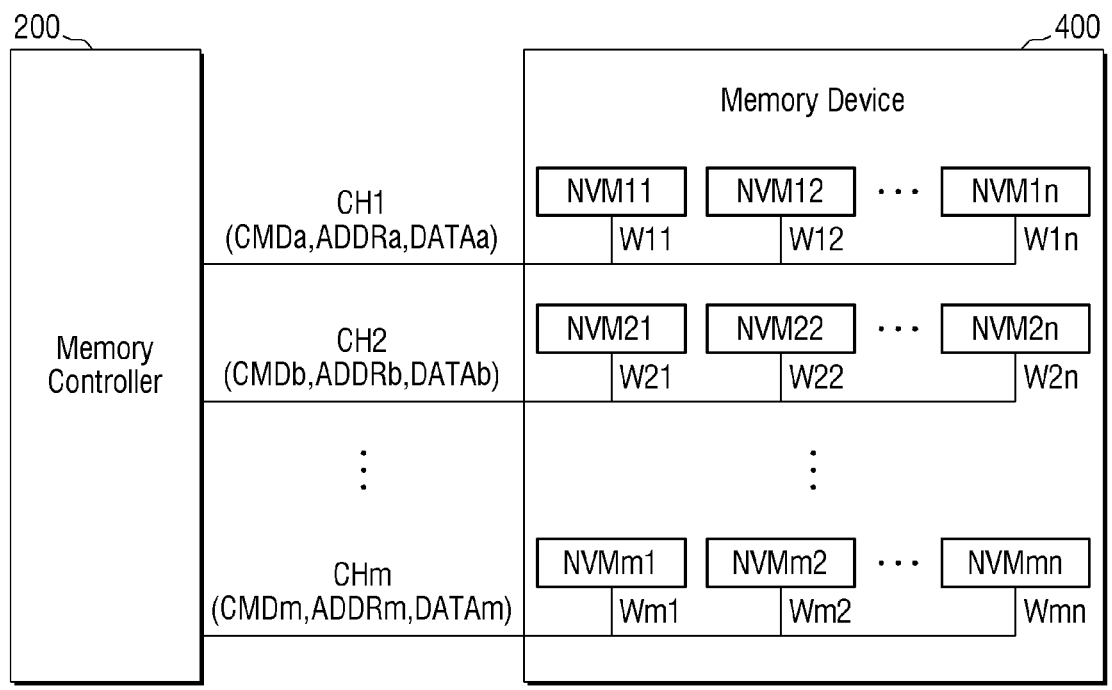
FIG. 3 is a block diagram further illustrating the storage device 10 of FIG. 1.

FIG. 3 is a block diagram further illustrating the storage controller 10 of FIG. 1.

Referring to FIG. 3, the storage device 10 may include a storage controller 200 and a nonvolatile memory 400. The storage device 10 may support a plurality of channels CH1 to CHm, and the storage controller 200 and the nonvolatile memory 400 may be connected through the channels CH1 to CHm. For example, the storage device 10 may be implemented as a storage device such as a solid state drive (SSD).

The nonvolatile memory 400 may include a plurality of nonvolatile memory devices NVM11 to NVMmn. Each of the nonvolatile memory devices NVM11 to NVMmn may be connected to at least one of the channels CH1 to CHm through a corresponding way. For example, the nonvolatile memory devices NVM11 to NVM1*n* may be connected to the first channel CH1 through the ways W11 to Win, and the nonvolatile memory devices NVM21 to NVM2*n* may be connected to the second channel CH2 through the ways W21 to W2*n*. In some embodiments, each of the nonvolatile memory devices NVM11 to NVMmn may be implemented in a random-access memory unit capable of operating in response with a command from the storage controller 200. For example, each of the nonvolatile memory devices NVM11 to NVMmn may be implemented as a chip or a die, but the inventive concept is not limited thereto.

The storage controller 200 may communicate various signals with the nonvolatile memory 400 through the channels CH1 to CHm. For example, the storage controller 200 may communicate commands CMDa to CMDm, addresses ADDRa to ADDRm and/or data DATAa to DATAm to the nonvolatile memory 400 through the channels CH1 to CHm.

The storage controller 200 may select one of the nonvolatile memory devices connected to the corresponding channel through each channel, and may communicate signals with the selected nonvolatile memory device. For example, the storage controller 200 may select the nonvolatile memory device NVM11 of the nonvolatile memory devices NVM11 to NVM1*n* connected to the first channel CH1. The storage controller 200 may communicate the command CMDa, the address ADDRa and the data DATAa with the selected nonvolatile memory device NVM11 through the first channel CH1.

The storage controller 200 may communicate signals with the nonvolatile memory 400 in parallel through different channels. For example, the storage controller 200 may transmit the command CMDb to the nonvolatile memory 400 through the second channel CH2 while transmitting the command CMDa to the nonvolatile memory 400 through the first channel CH1. For example, the storage controller 200 may receive the data DATAb from the nonvolatile memory 400 through the second channel CH2 while receiving the data DATAa from the nonvolatile memory 400 through the first channel CH1.

The storage controller 200 may be used to control overall operation of the nonvolatile memory 400. That is, the storage controller 200 may transmit respective signals via the channels CH1 to CHm to control each of the nonvolatile memory devices NVM11 to NVMmn connected to the channels CH1 to CHm. For example, the storage controller 200 may transmit the command CMDa and the address ADDRa to the first channel CH1 to control a selected one of the nonvolatile memory devices NVM11 to NVM1n.

Each of the nonvolatile memory devices NVM11 to NVMmn may operate under the control of the storage controller 200. For example, the nonvolatile memory device NVM11 may program the data DATAa in accordance with the command CMDa, the address ADDRa and the data DATAa, which are provided to the first channel CH1. For example, the nonvolatile memory device NVM21 may read the data DATAb in response to the command CMDb and the address ADDRb, which are provided to the second channel CH2, and may transmit the read data DATAb to the storage controller 200.

Although FIG. 3 shows the nonvolatile memory 400 communicating with the storage controller 200 using 'm' channels and including 'n' nonvolatile memory devices variously corresponding to the channels, those skilled in the art will appreciate that any reasonable number of channels and/or nonvolatile memory devices may be used in various arrangements.

Figure 4:
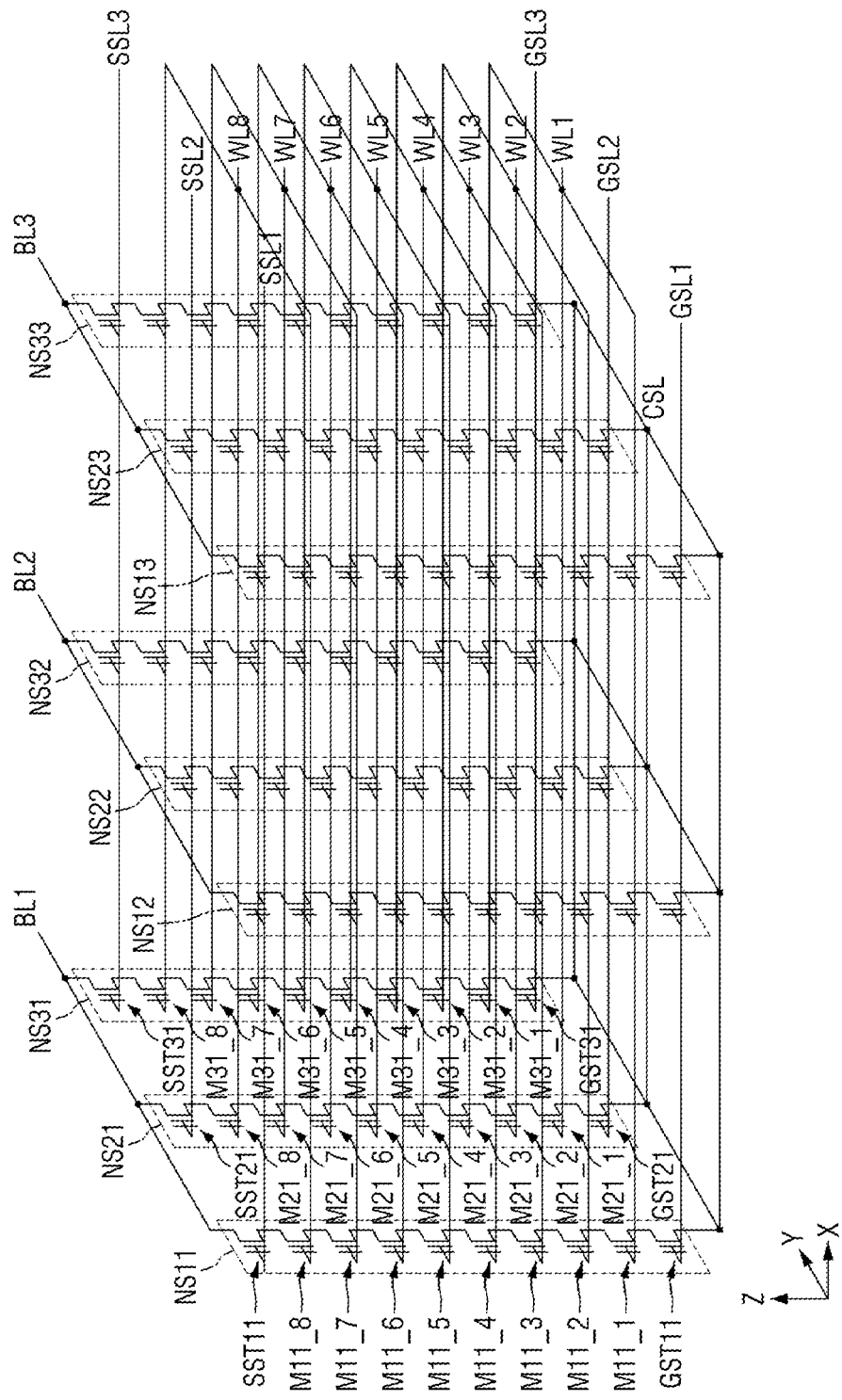
FIG. 4 is a partial circuit diagram further illustrating the memory cell array of FIG. 3.

FIG. 4 is an exemplary circuit diagram illustrating, in part, a memory cell array that may be incorporated within embodiments of the inventive concept.

Referring to FIG. 4, a memory cell array 410 may include a plurality of memory cell arrays. For example, the memory cell array 410 may include a plurality of cell strings NS11, NS21, NS31, NS12, NS22, NS32, NS13, NS23 and NS33. The plurality of cell strings NS11, NS21, NS31, NS12, NS22, NS32, NS13, NS23 and NS33 may be disposed on a substrate (not shown) in a first direction (e.g., a first horizontal (or X-) direction) and a second direction (e.g., a second horizontal (or Y-) direction), wherein the first direction intersects the second direction. Whereas, the plurality of cell strings NS11, NS21, NS31, NS12, NS22, NS32, NS13, NS23 and NS33 may extend in a third direction (e.g., a vertical (or Z-) direction), wherein the third direction is substantially orthogonal to the first and second directions. The plurality of cell strings NS11, NS21, NS31, NS12, NS22, NS32, NS13, NS23 and NS33 may commonly be connected to a common source line CSL formed on a substrate (not shown) or within a substrate (not shown). Although the common source line CSL is shown as being connected to the lowest end of the plurality of cell strings NS11, NS21, NS31, NS12, NS22, NS32, NS13, NS23 and NS33 in the third direction, it is sufficient that the common source line CSL is electrically connected to the lowest end of the plurality of cell strings NS11, NS21, NS31, NS12, NS22, NS32, NS13, NS23 and NS33 in the third direction. The common source line CSL is not limited to being physically positioned at a lower end of the plurality of cell strings NS11, NS21, NS31, NS12, NS22, NS32, NS13, NS23 and NS33. In addition, although the plurality of cell strings NS11, NS21, NS31, NS12, NS22, NS32, NS13, NS23 and NS33 are shown to be disposed in a 3×3 array, the array type and number of cell strings disposed in the memory cell array 410 may vary by design.

Some cell strings NS11, NS12 and NS13 may be connected with a first ground selection line (GSL) GSL1. Some cell strings NS21, NS22 and NS23 may be connected with a second ground selection line GSL2. Some cell strings NS31, NS32 and NS33 may be connected with a third ground selection line GSL3.

In addition, some cell strings NS11, NS12 and NS13 may be connected with a first string selection line (SSL) SSL1. Some cell strings NS21, NS22 and NS23 may be connected with a second string selection line SSL2. Some cell strings NS31, NS32 and NS33 may be connected with a third string selection line SSL3.

Each of the plurality of cell strings NS11, NS21, NS31, NS12, NS22, NS32, NS13, NS23 and NS33 may include a string selection transistor (SST) connected with each of the string selection lines. In addition, each of the plurality of cell strings NS11, NS21, NS31, NS12, NS22, NS32, NS13, NS23 and NS33 may include a ground selection transistor (GST) connected with each of the ground selection lines.

One end of the ground selection transistor of each of the plurality of cell strings NS11, NS21, NS31, NS12, NS22, NS32, NS13, NS23 and NS33 may be connected with the common source line CSL. In addition, a plurality of memory cells may sequentially be stacked between the ground selection transistor and the string selection transistor of each of the plurality of cell strings NS11, NS21, NS31, NS12, NS22, NS32, NS13, NS23 and NS33 in the third direction. Although not shown in this drawing, each of the plurality of cell strings NS11, NS21, NS31, NS12, NS22, NS32, NS13, NS23 and NS33 may include dummy cells between the ground selection transistor and the string selection transistor. And the number of string selection transistors may vary by design.

For example, the cell string NS11 may include a first ground selection transistor GST11 disposed at the lowest end in the third direction, a plurality of memory cells M11_1 to M11_8 sequentially stacked on the first ground selection transistor GST11 in the third direction, and a first string selection transistor SST11 stacked on the first memory cell M11_8 in the third direction. In addition, the cell string NS21 may include a first ground selection transistor GST21 disposed at the lowest end in the third direction, a plurality of memory cells M21_1 to M21_8 sequentially stacked on the first ground selection transistor GST21 in the third direction, and a first string selection transistor SST21 stacked on the first memory cell M21_8 in the third direction. In addition, the cell string NS31 may include a first ground selection transistor GST31 disposed at the lowest end in the third direction, a plurality of memory cells M31_1 to M31_8 sequentially stacked on the first ground selection transistor GST31 in the third direction, and a first string selection transistor SST31 stacked on the first memory cell M31_8 in the third direction. This configuration may be similarly applied to the other strings.

Memory cells positioned at the same height in the third direction from a substrate (not shown) or a ground selection transistor may electrically and commonly be connected to each word line. For example, the memory cells of the height at which the first memory cells M11_1, M21_1 and M31_1 are formed may be connected with the first word line WL1. In addition, the memory cells of the height at which the first memory cells M11_2, M21_2 and M31_2 are formed may be connected with the second word line WL2. The arrangement and structure of the memory cells connected with the third word line WL3 to the eighth word line WL8 may be similar, One end of the string selection transistor of each of the plurality of cell strings NS11, NS21, NS31, NS12, NS22, NS32, NS13, NS23 and NS33 may be connected with bit lines BL1, BL2 and BL3. For example, the string selection transistors SST11, SST21 and SST31 may be connected with the bit line BL1 extended in the second direction. Other string selection transistors connected with the bit lines BL2 and BL3 may be similar in configuration.

Memory cells corresponding to one string (or ground) selection line and one word line may form one page. The write operation and the read operation may be performed in units of each page. Each memory cell of each page may store two or more bits. The bits written in the memory cell of each page may form logic pages.

The memory cell array 410 may be provided as a 3D memory array. The 3D memory array may be monolithically formed at one or more physical levels of arrays of memory cells having an active area disposed over a circuit associated with the operation of the substrate (not shown) and memory cells. The circuit associated with the operation of the memory cells may be positioned in or over the substrate. The phrase "monolithically forming" denotes layers of the respective levels of the 3D array may be directly deposited on layers of lower levels of the 3D array.

Other aspects of the memory cell array 410 will be described with reference to FIGS. 5 and 6.

Figure 5:
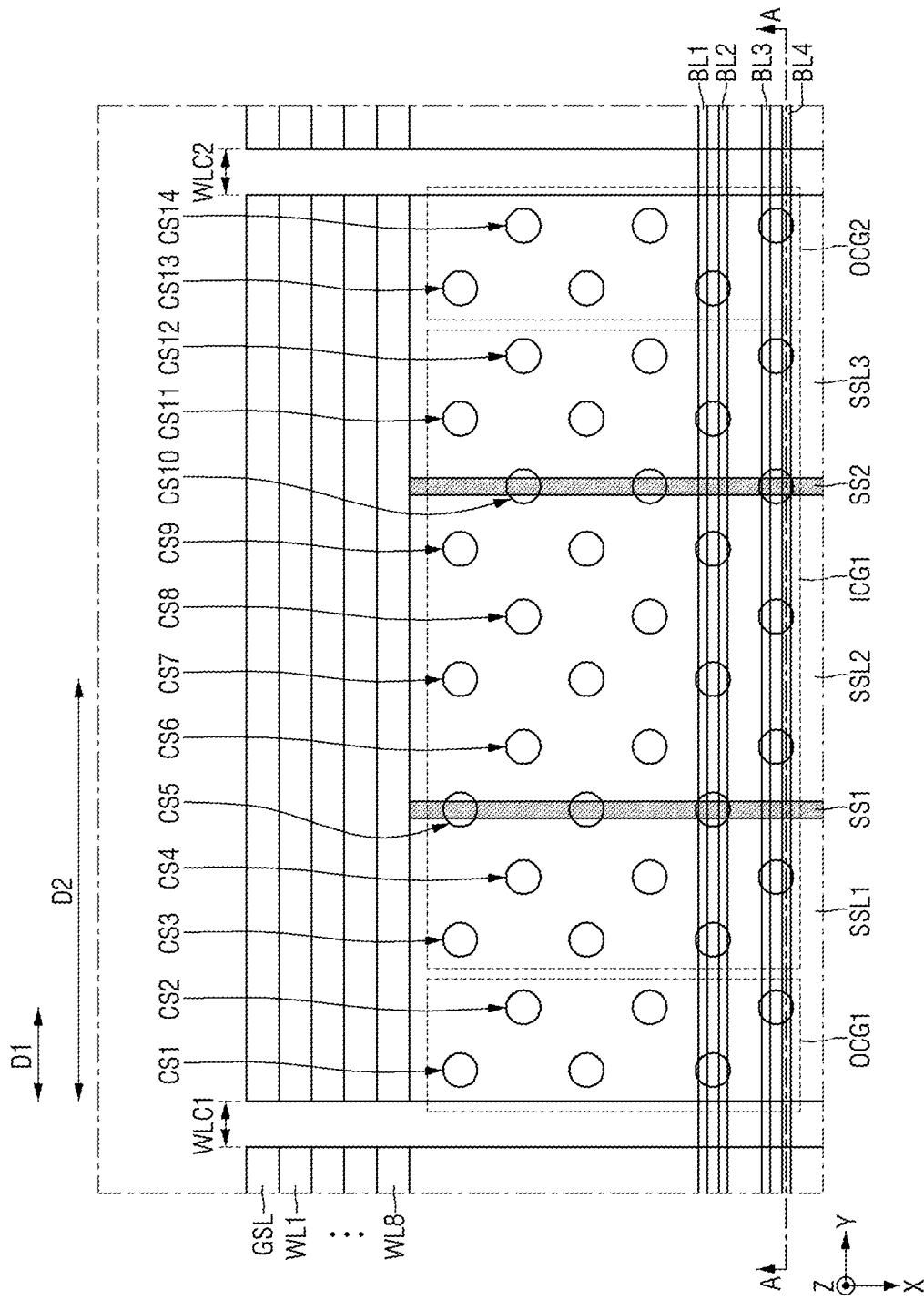
FIG. 5 is a plan (or top-down) view further illustrating the memory cell array of FIG. 4.
Figure 6:
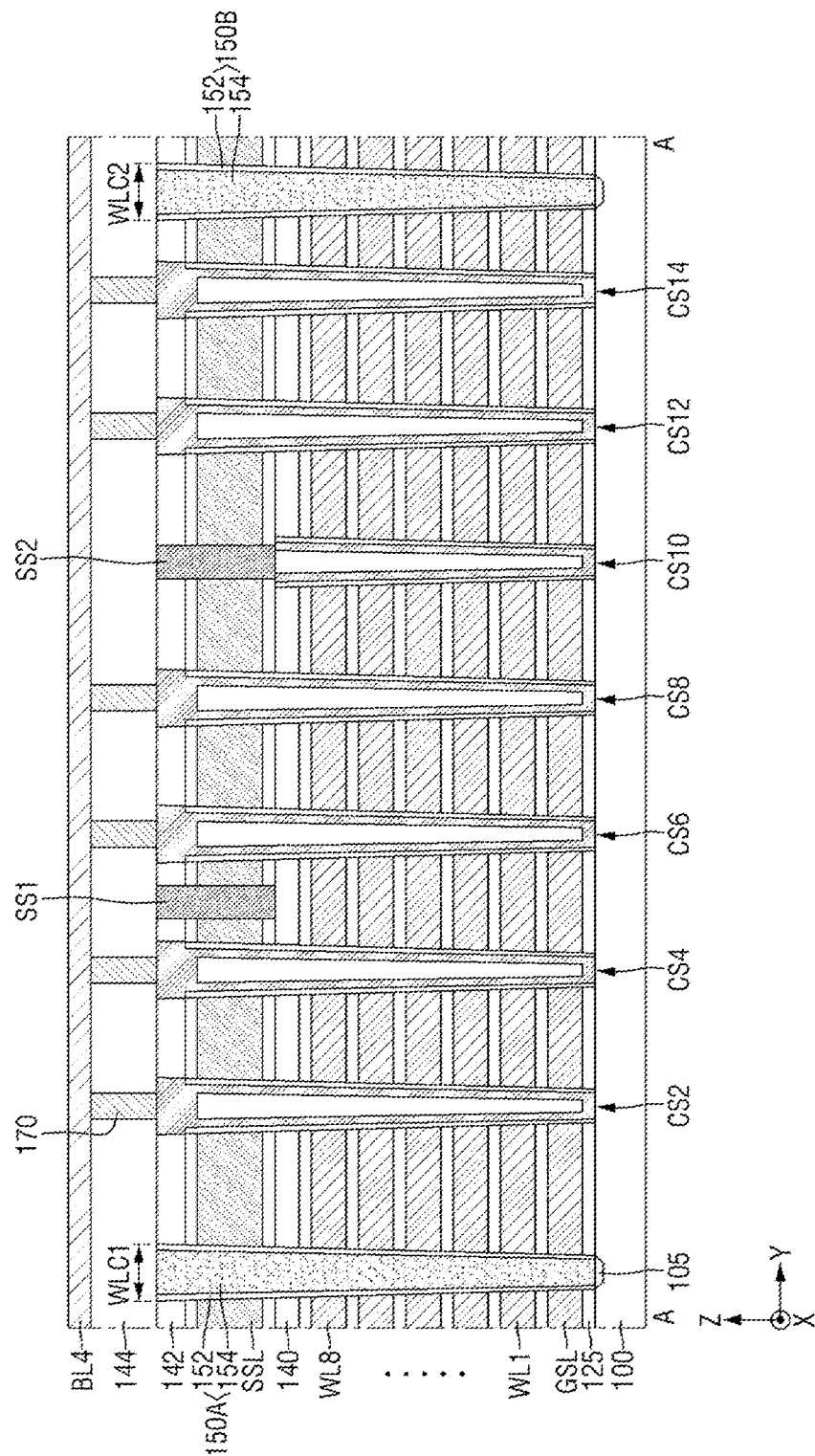
FIG. 6 is a cross-sectional view taken along line A-A of FIG. 5.

FIG. 5 is a plan (or top-down) view of a memory cell array 410, and FIG. 6 is a cross-sectional view taken along line A-A of FIG. 5.

Referring to FIGS. 5 and 6, the memory cell array 410 may include a substrate 100, gate electrodes GSL, WL1 to WLn and SSL, a plurality of insulating patterns 125, a first interlayer insulating layer 140, a second interlayer insulating layer 142, a third interlayer insulating layer 144, a bit line contact 170, a first word line cutting area WLC1, a second word line cutting area WLC2, a plurality of bit lines BL1 to BL4, and channel structures CS1 to CS14.

a. The substrate 100 may include a semiconductor substrate such as a silicon substrate, a germanium substrate or a silicon-germanium substrate. Alternatively, the substrate 100 may include a silicon-on-insulator (SOI) substrate or a germanium-on-insulator (GOI) substrate.

The gate electrodes GSL, WL1 to WLn and SSL may be stacked on the substrate 100. In this case, the plurality of insulating patterns 125 may be formed between the gate electrodes GSL, WL1 to WLn and SSL. The gate electrodes GSL, WL1 to WLn and SSL and the insulating pattern 125 may be layered structures extended in the first direction and the second direction. The ground selection line GSL, the plurality of word lines WL1 to WLn and the string selection line SSL may be stacked in a stepwise form.

The ground selection line GSL and the plurality of word lines WL1 to WLn may include a conductive material. For example, the ground selection line GSL and the plurality of word lines WL1 to WLn may include metal such as tungsten (W), cobalt (Co) and nickel (Ni), or a semiconductor material such as silicon, but are not limited thereto. The string selection line SSL may include a conductive material. For example, the string selection line SSL may include polysilicon, but is not limited thereto.

In some embodiments, the string selection line SSL may include a first string selection line SSL1, a second string selection line SSL2, and a third string selection line SSL3. In this case, the first string selection line SSL1 and the second string selection line SSL2 may be spaced apart by a first cutting line SS1 extended in the first direction. The second string selection line SSL2 and the third string selection line SSL3 may be spaced apart by a second cutting line SS2 extended in the first direction. Therefore, the first string selection line SSL1 may be disposed between the first word line cutting area WLC1 and the first cutting line SS1, the second string selection line SSL2 may be disposed between the first cutting line SS1 and the second cutting line SS2, and the third string selection line SSL3 may be disposed between the second cutting line SS2 and the second word line cutting area WLC2. The first to third string selection lines SSL1 to SSL3 may be sequentially arranged in the second direction from the first word line cutting area WLC1.

The insulating pattern 125 formed between the gate electrodes GSL, WL1 to WLn and SSL may include an insulating material. For example, the insulating pattern 125 may include silicon oxide, but is not limited thereto. The first interlayer insulating layer 140, the second interlayer insulating layer 142, and the third interlayer insulating layer 144 may be stacked on the string selection line SSL. The first interlayer insulating layer 140, the second interlayer insulating layer 142 and the third interlayer insulating layer 144 may include an insulating material.

The bit line contact 170 may connect the plurality of channel structures CS1 to CS14 with the plurality of bit lines BL1 to BL4. The plurality of bit lines BL1 to BL4 may be extended in the second direction. In addition, The respective bit lines BL1 to BL4 may be spaced apart in the first direction. The bit lines BL1 to BL4 may control the channel structures CS1 to CS14 through the bit line contact 170.

The first word line cutting area WLC1 and the second word line cutting area WLC2 may separate a mold structure that includes a ground selection line GSL, word lines WL1 to WL8, and a string selection line SSL. The first word line cutting area WLC1 and the second word line cutting area WLC2 may be extended in the first direction to cut the mold structure.

In some embodiments, a first cutting structure 150A may be formed in the first word line cutting area WLC1, and a second cutting structure 150B may be formed in the second word line cutting area WLC2. The first cutting structure 150A and the second cutting structure 150B may be extended to the substrate 100 by passing through the mold structure. Therefore, the first cutting structure 150A and the second cutting structure 150B may be extended in parallel along the first direction to cut the mold structure. In some embodiments, each of the first cutting structure 150A and the second cutting structure 150B may include a plug pattern 154 and a spacer 152.

The plug pattern 154 may be connected to the substrate 100 by passing through the mold structure. In some embodiments, the plug pattern 154 may be provided as the common source line CSL of the nonvolatile memory device according to some embodiments. For example, the plug pattern 154 may include a conductive material. Also, the plug pattern 154 may be connected to an impurity area 105 in the substrate 100. The impurity area 105 may be extended in the first direction, for example.

Voltages that are electrically the same may be applied to the plug pattern 154 of the first cutting structure 150A and the plug pattern 154 of the second cutting structure 150B, or different voltages may be applied thereto, so that the plug pattern 154 of the first cutting structure 150A and the plug pattern 154 of the second cutting structure 150B may be separately controlled.

The spacer 152 may be interposed between the plug pattern 154 and the mold structure. For example, the spacer 152 may be extended along a sidewall of the plug pattern 154. The spacer 152 may include an insulating material. Therefore, the plug pattern 154 may be electrically spaced apart (or isolated) from the plurality of gate electrodes GSL, WL1 to WLn and SSL of the mold structure.

The plurality of channel structures CS1 to CS14 may be disposed within the mold structure described above. The plurality of channel structures CS1 to CS14 may be connected to the substrate 100 by passing through the plurality of gate electrodes GSL, WL1 to WLn and SSL. The plurality of channel structures CS1 to CS14 may have a pillar shape extended in the third direction.

The plurality of channel structures CS1 to CS14 may be sequentially disposed in the second direction from the first word line cutting area WLC1. The memory cell array 410 may include fourteen (14) channel structures or holes between the first word line cutting area WLC1 and the second word line cutting area WLC2. Therefore, the memory cell array 410 according to the embodiment of the inventive concept may correspond to a 14-hole VNAND.

The first to fourth channel structures CS1 to CS4 may pass through the first string selection line SSL1. That is, the first to fourth channel structures CS1 to CS4 may be disposed to be close to the first word line cutting area WLC1. In addition, the first to fourth channel structures CS1 to CS4 may be sequentially arranged in a zigzag pattern in the second direction. The fifth channel structure CS5 may be formed in an area where the first cutting line SS1 is disposed. The first to fourth channel structures CS1 to CS4, the ground selection line GSL, the word lines WL1 to WL8, and the first string selection line SSL1 may correspond to the cell strings NS11, NS12 and NS13 that share the first string selection line SSL1 of FIG. 4. That is, the cell strings NS11, NS12 and NS13 may be selected and operated by the first string selection line SSL1.

The sixth to ninth channel structures CS6 to CS9 may pass through the second string selection line SSL2. That is, the sixth to ninth channel structures CS6 to CS9 may be disposed between the first cutting line SS1 and the second cutting line SS2. In addition, the sixth to ninth channel structures CS6 to CS9 may be sequentially arranged in a zigzag pattern in the second direction. The tenth channel structure CS10 may be formed in the area where the second cutting line SS2 is disposed. The sixth to ninth channel structures CS6 to CS9, the ground selection line GSL, the word lines WL1 to WL8, and the second string selection line SSL2 may correspond to the cell strings NS21, NS22 and NS23 that share the second string selection line SSL2 of FIG. 4. That is, the cell strings NS21, NS22 and NS23 may be selected and operated by the second string selection line SSL2.

The eleventh to fourteenth channel structures CS11 to CS14 may pass through the third string selection line SSL3. That is, the eleventh to fourteenth channel structures CS11 to CS14 may be disposed between the second cutting line SS2 and the second word line cutting area WLC2. In addition, the eleventh to fourteenth channel structures CS11 to CS14 may be arranged in a zigzag pattern in a second direction. The eleventh to fourteenth channel structures CS11 to CS14, the ground selection line GSL, the word lines WL1 to WL8, and the third string selection line SSL3 may correspond to the cell strings NS31, NS32 and NS33 that share the third string selection line SSL3 of FIG. 4. That is, the cell strings NS31, NS32 and NS33 may be selected and operated by the third string selection line SSL3.

In some embodiments, a first outer channel structure group OCG1 may include channel structures disposed to be close to the first word line cutting area WLC1. For example, the first outer channel structure group OCG1 may include the first and second channel structures CS1 and CS2. A second outer channel structure group OCG2 may include channel structures disposed to be close to the second word line cutting area WLC2. For example, the second outer channel structure group OCG2 may include the thirteenth and fourteenth channel structures CS13 and CS14.

A first inner channel structure group ICG1 may include channel structures disposed to be further away from the first word line cutting area WLC1. For example, the first inner channel structure group ICG1 may include the third to twelfth channel structures CS3 to CS12. The first inner channel structure group ICG1 may be disposed between the first outer channel structure group OCG1 and the second outer channel structure group OCG2.

The string selection transistor operated by the channel structure corresponding to the first inner channel structure group ICG1 may have a characteristic different from that of the string selection transistor operated by the channel structure corresponding to the first outer channel structure group OCG1 and the second outer channel structure group OCG2. For example, a program speed of the string selection transistor operated by the first inner channel structure group ICG1 may be slower than that of the string selection transistor operated by the first outer channel structure group OCG1 and the second outer channel structure group OCG2. Therefore, a threshold voltage program of the string selection transistor is required in consideration of the corresponding characteristic.

The first string selection line SSL1 may be spaced apart from the first word line cutting area WLC1 as much as a first distance D1, and the second string selection line SSL2 may be spaced apart from the first word line cutting area WLC1 as much as a second distance D2. In this case, the second distance D2 may be greater than the first distance D1. That is, the second string selection line SSL2 may be disposed inside as compared with the first string selection line SSL1 and the third string selection line SSL3.

Figure 7:
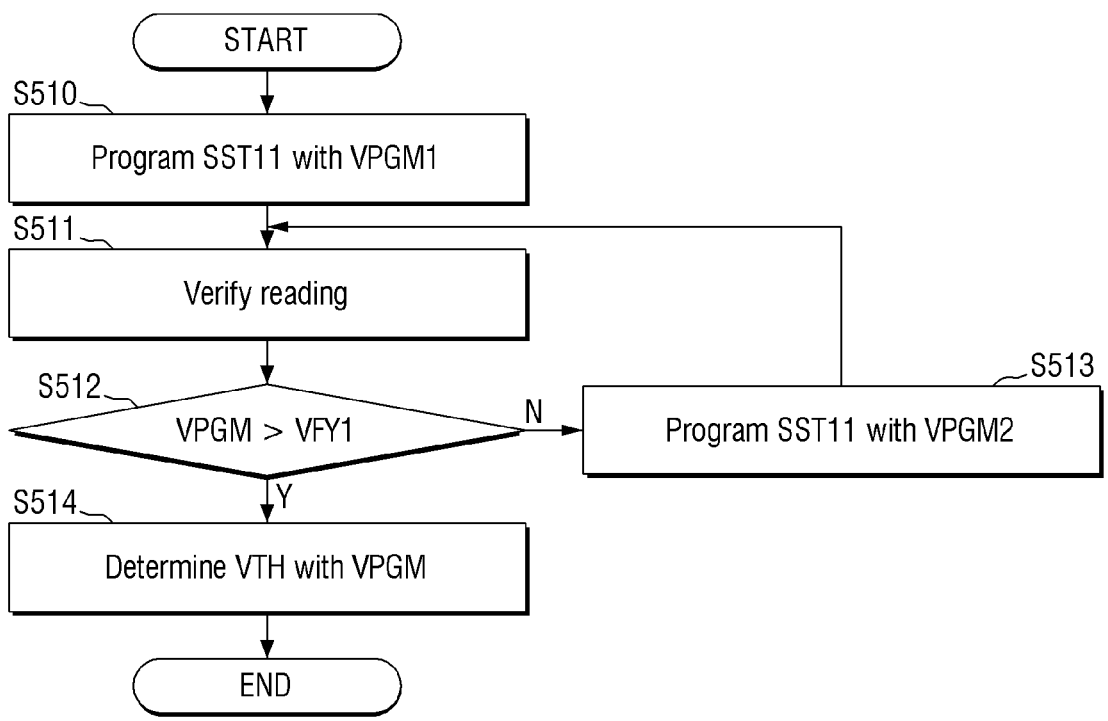
FIG. 7 is a flow chart illustrating a method of programming a string selection transistor according to embodiments of the inventive concept.
Figure 8:
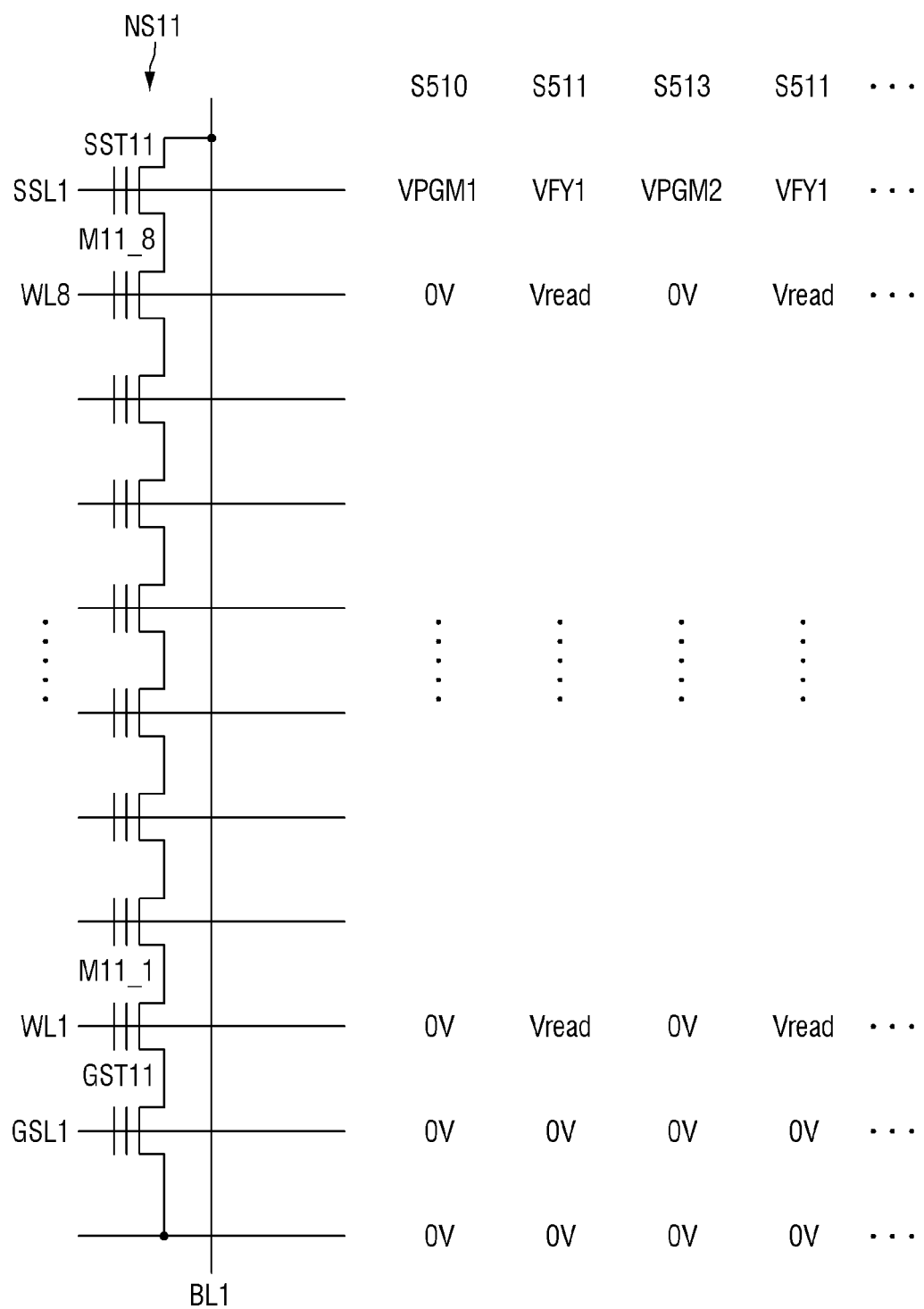
FIG. 8 is a conceptual diagram illustrating operation of the string selection transistor of FIG. 7.

Hereinafter, an exemplary programming method for the first string selection transistor SST11 will be described with reference to FIGS. 7, 8 and 9. Here, FIG. 7 is a flow chart illustrating a method of programming a string selection transistor according to embodiments of the inventive concept; FIG. 8 is a conceptual diagram illustrating operation of the string selection transistor of FIG. 7; and FIG. 9 is a scatter plot diagram illustrating a threshold voltage of the string selection transistor of FIG. 7.

Figure 9:
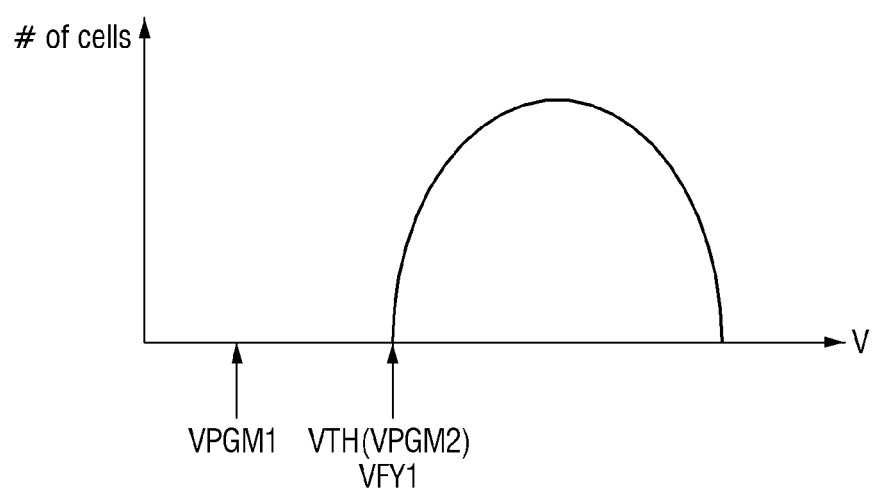
FIG. 9 is a scatter plot diagram illustrating a threshold voltage for the string selection transistor of FIG. 7.

Referring to FIGS. 7, 8 and 9, the storage controller 200 may program the first string selection transistor SST11 using a first program voltage VPGM1 (S510). Although the first string selection transistor SST11 is described here as an example, corresponding operation(s) may be performed in relation to other string selection transistors.

The cell string NS11 may include a first ground selection transistor GST11, a plurality of first memory cells M11_1 to M11_8, and a first string selection transistor SST11, which are connected in series. The cell string NS11 may be connected to the peripheral circuit through the first bit line BL1. In this case, the first ground selection transistor GST11 may be connected to the first ground selection line GSL1, the plurality of first memory cells M11_1 to M11_8 may be connected to the first to eighth word lines WL1 to WL8, and the first string selection transistor SST11 may be connected to the first string selection line SSL1. In this case, the first string selection transistor SST11 may determine whether the cell string NS11 is connected to the first bit line BL1.

The first program voltage VPGM1 may be applied to the first string selection line SSL1, 0V may be applied to the first to eighth word lines WL1 to WL8, and 0V may be applied to the first ground selection line GSL1 (S510). Therefore, a threshold voltage VTH of the first string selection transistor SST11 connected to the first string selection line SSL1 may be programmed with the first program voltage VPGM1.

Then, a verification reading may be performed (S511). The storage controller 200 may determine whether a level of the program voltage is greater than that of a first verifying voltage VFY1, through the verification reading (S512). For example, the first verifying voltage VFY1 may be applied to the first string selection line SSL1, a read voltage Vread may be applied to the first to eighth word lines WL1 to WL8, and 0V may be applied to the first ground selection line GSL1. Therefore, the first program voltage VPGM1 corresponding to the threshold voltage VTH of the first string selection transistor SST11 may be determined to be greater than the first verifying voltage VFY1.

When the first program voltage VPGM1 corresponding to the threshold voltage VTH of the first string selection transistor SST11 is not greater than the first verifying voltage VFY1 (S512=No), the storage controller 200 may program the first string selection transistor SST11 using a second program voltage VPGM2 (S513). In this case, a level of the second program voltage VPGM2 is greater than that of the first program voltage VPGM1. Therefore, the threshold voltage VTH of the first string selection transistor SST11 may be the second program voltage VPGM2.

Subsequently, the verification reading may be performed (S511), and it may be determined whether the second program voltage VPGM2 is greater than the first verifying voltage VFY1 (S512). Referring to FIG. 9, the second program voltage VPGM2 corresponding to the threshold voltage VTH may be greater than the first verifying voltage VFY1. That is, when the second program voltage VPGM2 corresponding to the threshold voltage VTH of the first string selection transistor SST11 is greater than the first verifying voltage VFY1 (S512=Yes), the nonvolatile memory 400 may determine the threshold voltage VTH as the program voltage (S514). That is, through this operation, the threshold voltage VTH of the first string selection transistor SST11 may be the second program voltage VPGM2.

Figure 10:
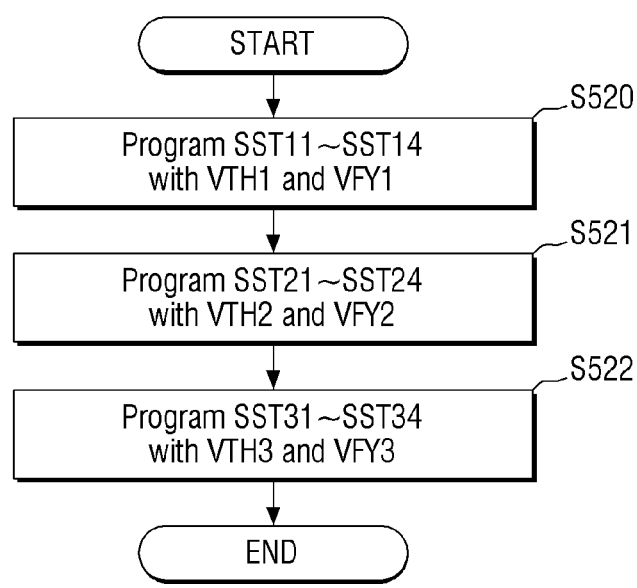
FIG. 10 is a flow chart illustrating a method of programming a plurality of string selection transistors according to embodiments of the inventive concept.
Figure 11:
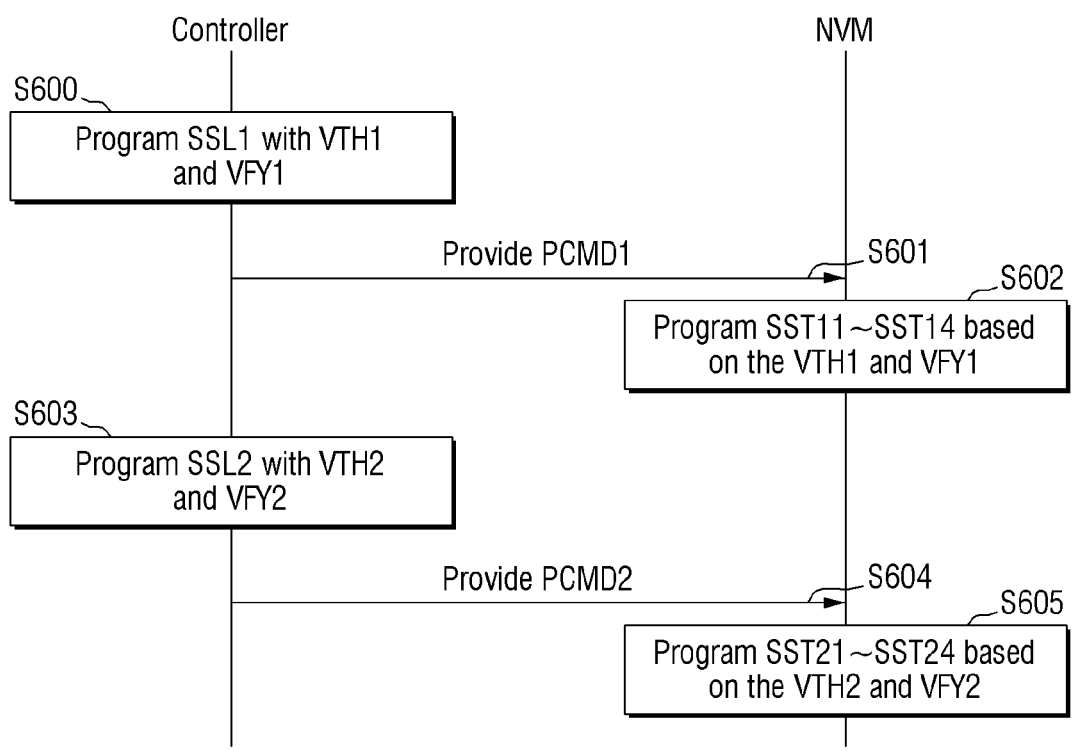
FIG. 11 is a flow diagram illustrating signal transfer between a controller and a nonvolatile memory.
Figure 12:
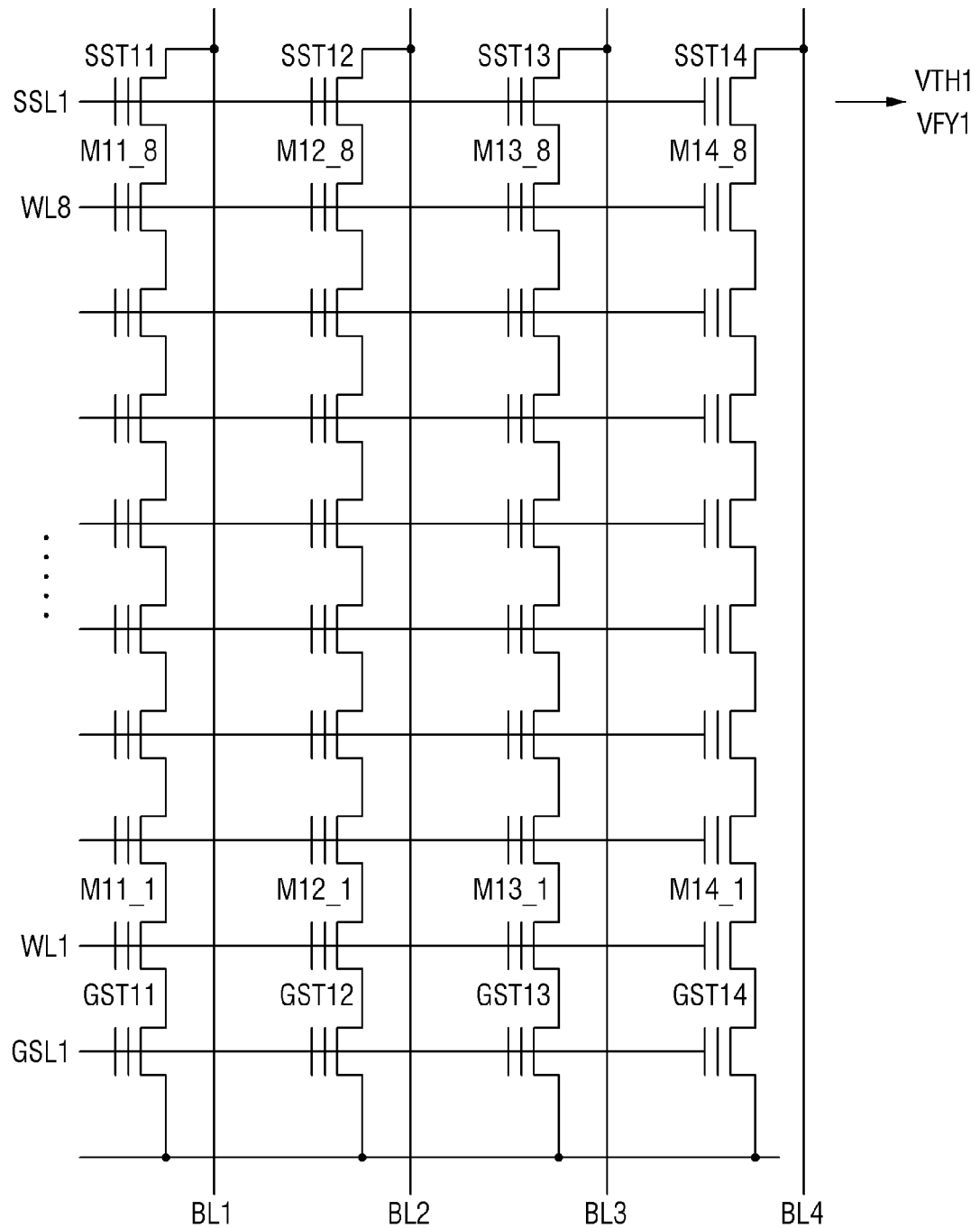
FIGS. 12 and 13 are respective circuit diagrams illustrating a programming method for the first and second memory cell arrays.
Figure 13:
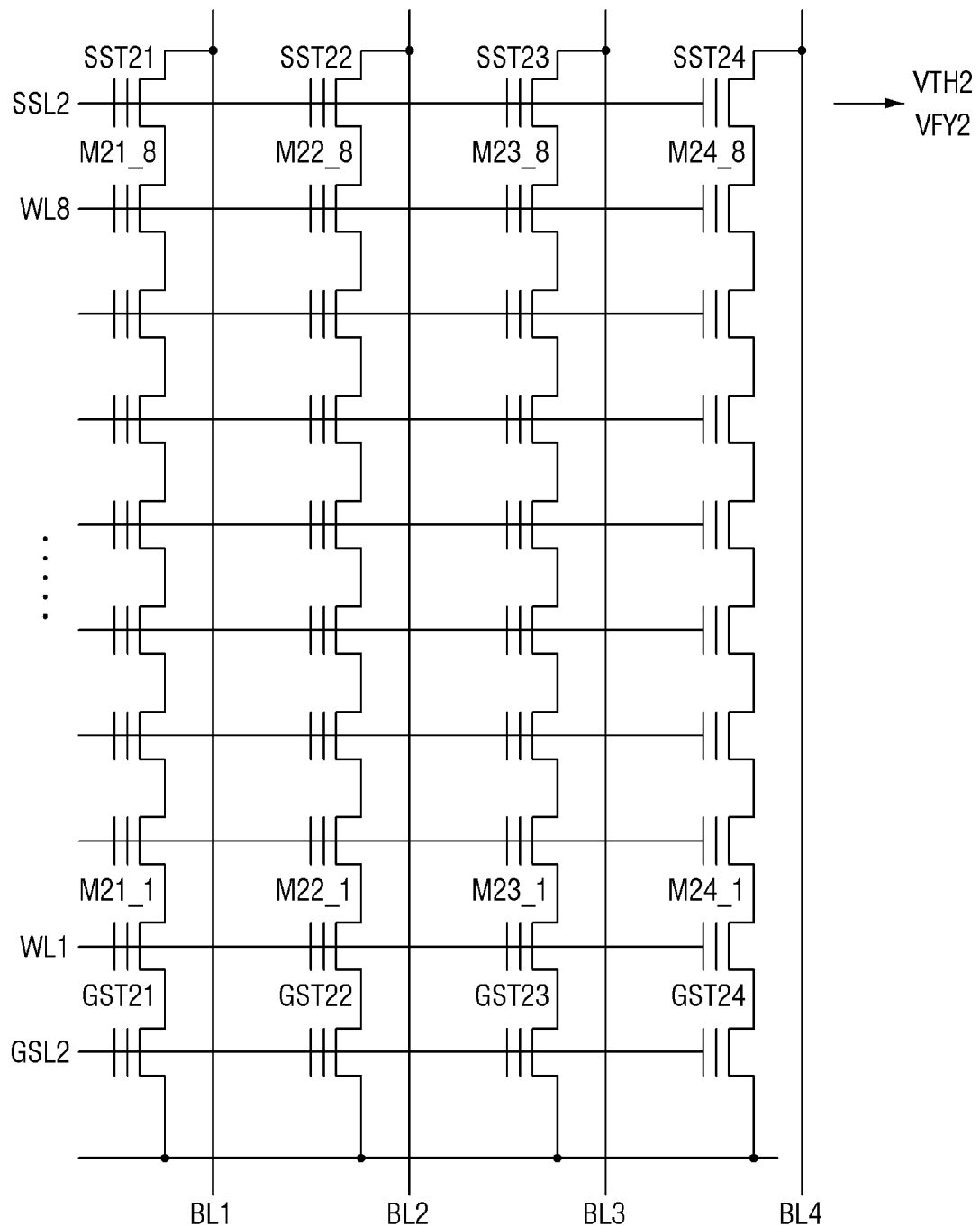
Figure 14:
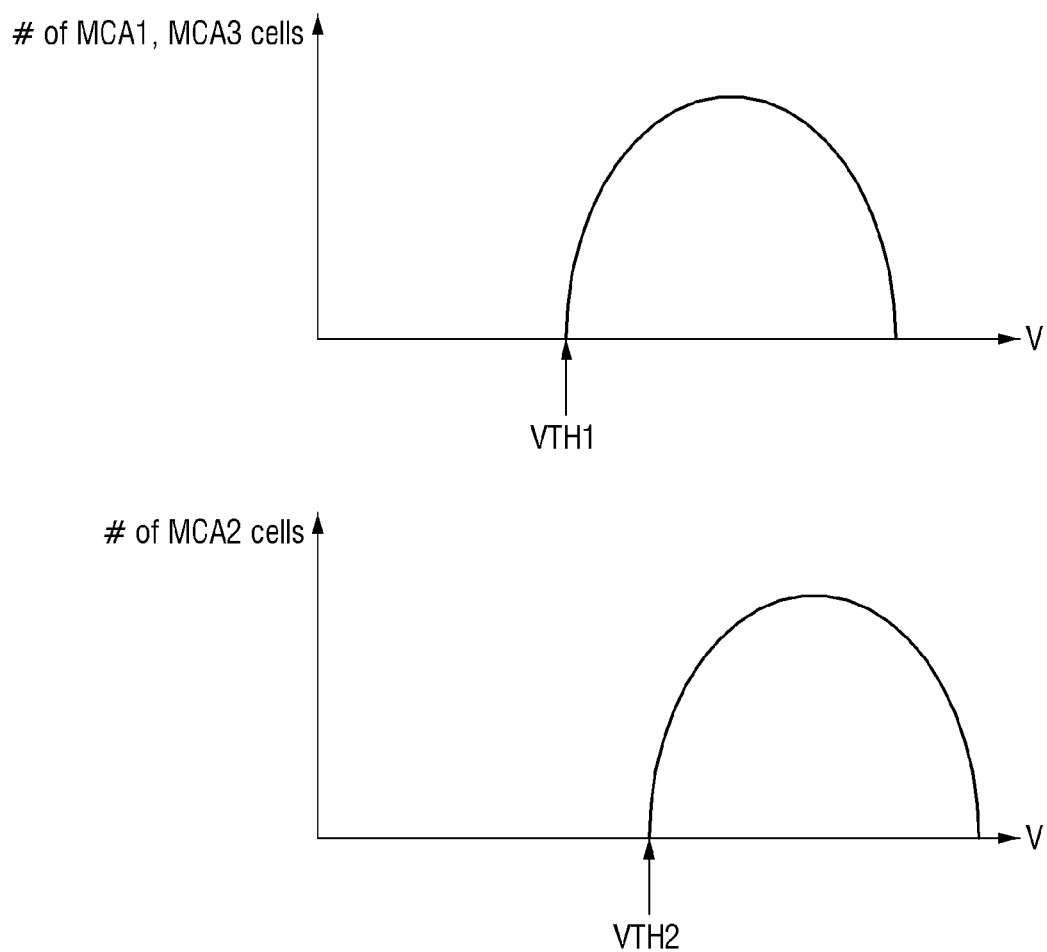
FIGS. 14 and 15 are respective scatter diagrams illustrating threshold voltages of string selection transistors according to embodiments of the inventive concept.

Hereinafter, a threshold voltage programming method for a plurality of string selection transistors SST11 to SST34 connected to a plurality of string selection lines SSL1 to SSL3 will be described with reference to FIGS. 10, 11, 12, 13 and 14. Here, FIG. 10 is a flow chart illustrating a method of programming a plurality of string selection transistors according to embodiments of the inventive concept; FIG. 11 is a flow diagram illustrating signal communication between a controller and a nonvolatile memory; FIGS. 12 and 13 are respective conceptual diagrams illustrating a programming method for the first and second memory cell arrays; and FIG. 14 is a scatter diagram illustrating threshold voltages for the string selection transistors of FIGS. 12 and 13.

Referring to FIGS. 10, 11, 12 and 13, the storage controller 200 may program a threshold voltage of a plurality of string selection transistors SST11 to SST34 included in the memory cell array 410. A first memory cell array MCA1 of FIG. 12 may correspond to the cell strings NS11, NS12 and NS13 that share the first string selection line SSL1 of FIG. 4, and a second memory cell array MCA2 of FIG. 13 may correspond to the cell strings NS21, NS22 and NS23 that share the second string selection line SSL2 of FIG. 4. In addition, the first memory cell array MCA1 of FIG. 12 may correspond to the first to fourth channel structures CS1 to CS4 of FIG. 6, and the second memory cell array MCA2 of FIG. 13 may correspond to the sixth to ninth channel structures CS6 to CS9 of FIG. 6.

A distance from the first word line cutting area WLC1 to the first string selection line SSL1 of the first memory cell array MCA1 may be less than a distance from the first word line cutting area WLC1 to the second string selection line SSL2 of the second memory cell array MCA2.

First, the storage controller 200 may program the first to fourth string selection transistors SST11 to SST14 using the first threshold voltage VTH1 and the first verifying voltage VFY1 (S520). For example, the storage controller 200 may program the first string selection line SSL1 using the first threshold voltage VTH1 and the first verifying voltage VFY1 (S600). In this case, the storage controller 200 may provide a first program command PCMD1 to the nonvolatile memory 400 (S601). The nonvolatile memory 400 may program a threshold voltage of the first to fourth string selection transistors SST11 to SST14 in response to the first program command PCMD1. For example, the nonvolatile memory 400 may program the first to fourth string selection transistors SST11 to SST14 using the first threshold voltage VTH1 and the first verifying voltage VFY1 (S602). That is, the first program command PCMD1 may correspond to a command indicating a program of the threshold voltage of the first to fourth string selection transistors SST11 to SST14.

Referring to FIG. 12, the first memory cell array MCA1 may include first to fourth ground selection transistors GST11 to GST14 connected to the first ground selection line GSL1, first to fourth memory cells M11_1 to M11_8, M12_1 to M12_8, M13_1 to M13_8 and M14_1 to M14_8 connected to the first to eighth word lines WL1 to WL8, and first to fourth string selection transistors SST11 to SST14 connected to the first string selection line SSL1. Each of the cell strings may be connected to the first to fourth bit lines BL1 to BL4.

In this case, the first string selection line SSL1 may be programmed with the first threshold voltage VTH1. In addition, the first threshold voltage VTH1 may have a voltage level greater than that of the first verifying voltage VFY1. That is, the first string selection line SSL1 may have a first threshold voltage VTH1. The first to fourth string selection transistors SST11 to SST14 connected to the first string selection line SSL1 may also have a first threshold voltage VTH1. That is, the first to fourth string selection transistors SST11 to SST14 may be turned ON when a voltage having a voltage level greater than that of the first threshold voltage VTH1 is applied to a gate.

In this case, an outer string selection transistor SST_O may include first and second string selection transistors SST11 and SST12, and an inner string selection transistor SST_I may include third and fourth string selection transistors SST13 and SST14. In this case, the outer string selection transistor SST_O may correspond to a string selection transistor of the first outer channel structure group OCG1 of FIG. 5, and the inner string selection transistor SST_I may correspond to a string selection transistor of the first inner channel structure group ICG1. That is, the first and second string selection transistors SST11 and SST12 and the third and fourth string selection transistors SST13 and SST14 may have different characteristics depending on the distance from the first word line cutting area WLC1.

Referring to FIG. 14, the threshold voltage of the first to fourth string selection transistors SST11 to SST14 of the first memory cell array MCA1 may be programmed with the first threshold voltage VTH1.

Referring to FIGS. 10, 11 and 13, the storage controller 200 may program the first to fourth string selection transistors SST21 to SST24 using a second threshold voltage VTH2 and a second verifying voltage VFY2 (S521). For example, the storage controller 200 may program the first string selection line SSL1 using the second threshold voltage VTH2 and the second verifying voltage VFY2 (S600). In this case, a level of the second threshold voltage VTH2 may be greater than that of the first threshold voltage VTH1, and a level of the second verifying voltage VFY2 may be greater than that of the first verifying voltage VFY1.

In this case, the storage controller 200 may provide a second program command PCMD2 to the nonvolatile memory 400 (S603). The nonvolatile memory 400 may program a threshold voltage of the first to fourth string selection transistors SST21 to SST24 in response to the second program command PCMD2. For example, the nonvolatile memory 400 may program the first to fourth string selection transistors SST21 to SST24 using the second threshold voltage VTH2 and the second verifying voltage VFY2 (S605). That is, the second program command PCMD2 may correspond to a command indicating a program of the threshold voltage of the first to fourth string selection transistors SST21 to SST24.

Referring to FIG. 13, the second memory cell array MCA2 may include first to fourth ground selection transistors GST21 to GST24 connected to the second ground selection line GSL2, first to fourth memory cells M21_1 to M21_8, M22_1 to M22_8, M23_1 to M23_8 and M24_1 to M24_8, and first to fourth string selection transistors SST21 to SST24 connected to the second string selection line SSL2. Each of the cell strings may be connected to the first to fourth bit lines BL1 to BL4.

In this case, the second string selection line SSL2 may be programmed with the second threshold voltage VTH2. In addition, the second threshold voltage VTH2 may have a voltage level greater than that of the second verifying voltage VFY2. That is, the second string selection line SSL2 may have a second threshold voltage VTH2. The first to fourth string selection transistors SST21 to SST24 connected to the second string selection line SSL2 may also have a second threshold voltage VTH2. That is, the first to fourth string selection transistors SST21 to SST24 may be turned ON when a voltage having a voltage level greater than that of the second threshold voltage VTH2 is applied to a gate.

In this case, the inner string selection transistor SST_I may include first and fourth string selection transistors SST21 and SST24, and more inner string selection transistor SST_MI may include second and third string selection transistors SST22 and SST23. In this case, the inner string selection transistor SST_I may correspond to the sixth channel structure CS6 and the ninth channel structure CS9 of FIG. 5, and the more inner string selection transistor SST_MI may correspond to the seventh and eighth channel structures CS7 and CS8 of FIG. 5. That is, the first and fourth string selection transistors SST21 and SST24 and the second and third string selection transistors SST22 and SST23 may have different characteristics depending on the distance from the first word line cutting area WLC1 or the second word line cutting area WLC2.

Referring to FIG. 14, a threshold voltage of the first to fourth string selection transistors SST21 to SST24 of the second memory cell array MCA2 may be programmed with the second threshold voltage VTH2. The second threshold voltage VTH2 may be different from the first threshold voltage VTH1. That is, the level of the second threshold voltage VTH2 may be greater than that of the first threshold voltage VTH1. Therefore, the threshold voltage of the first to fourth string selection transistors SST21 to SST24 farther spaced apart from the first word line cutting area WLC1 may be greater than that of the first to fourth string selection transistors SST11 to SST14 disposed to be close to the first word line cutting area WLC1. Therefore, a level of a voltage applied to the second string selection line SSL2 may be greater than that of a voltage applied to the first string selection line SSL1.

As a length from the first word line cutting area WLC1 or the second word line cutting area WLC2 to the string selection line SSL is increased, a program speed for the string selection transistor may be reduced. Therefore, the threshold voltage of the first to fourth string selection transistors SST21 to SST24 may be set to the second threshold voltage VTH2 having a level greater than that of the first threshold voltage VTH1, whereby the nonvolatile memory 400 having improved performance and reliability may be provided.

Referring back to FIG. 10, the storage controller 200 may program the first to fourth string selection transistors SST31 to SST34 using a third threshold voltage VTH3 and a third verifying voltage VFY3 (S522). In this case, a level of the third threshold voltage VTH3 may be less than that of the second threshold voltage VTH2, and a level of the third verifying voltage VFY3 may be less than that of the second verifying voltage VFY2. In addition, the level of the third threshold voltage VTH3 may be equal to that of the first threshold voltage VTH1, and the level of the third verifying voltage VFY3 may be equal to that of the first verifying voltage VFY1. However, the embodiments of the inventive concept are not limited to the above example.

Referring to FIG. 5, the first to fourth string selection transistors SST31 to SST34 may be connected to the third string selection line SSL3. That is, the first to fourth string selection transistors SST31 to SST34 may be disposed to be close to the first word line cutting area WLC1 or the second word line cutting area WLC2 like the first to fourth string selection transistors SST11 to SST14. Therefore, the first to fourth string selection transistors SST31 to SST34 may have the same characteristics as those of the first to fourth string selection transistors SST11 to SST14.

Referring to FIG. 14, a threshold voltage of a first to fourth string selection transistors SST31 to SST34 of a third memory cell array MCA3 may be programmed with the first threshold voltage VTH1. That is, a level of the threshold voltage of the first to fourth string selection transistors SST31 to SST34 may be less than that of the second threshold voltage VTH2. Therefore, a level of a voltage applied to the third string selection line SSL3 may be less than that of a voltage applied to the second string selection line SSL2.

Figure 15:
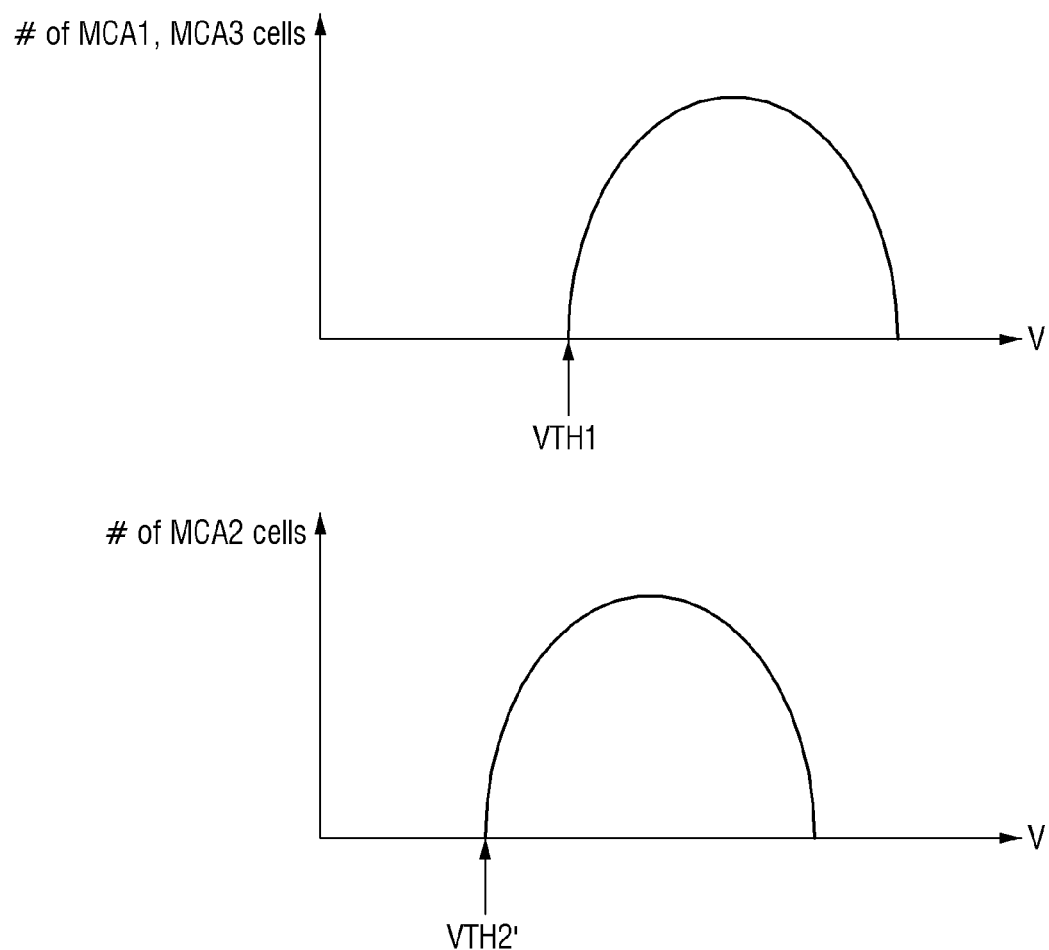

FIG. 15 is a scatter diagram illustrating a threshold voltage for string selection transistor(s) according to other embodiments of the inventive concept.

Referring to FIG. 15, the first to fourth string selection transistors SST11 to SST14 of the first memory cell array MCA1 and the first to fourth string selection transistors SST31 to SST34 of the third memory cell array MCA3 may have a first threshold voltage VTH1. In addition, the first to fourth string selection transistors SST21 to SST24 of the second memory cell array MCA2 may have a second threshold voltage VTH2'. In this case, a level of the second threshold voltage VTH2' may be less than that of the first threshold voltage VTH1, but the embodiments of the inventive concept are not limited thereto.

Hereinafter, an operation method for the nonvolatile memory 400 including string selection lines SSL1 to SSL3 programmed with their respective threshold voltages different from one another will be described with reference to FIGS. 16, 17, 18, 19 and 20.

Figure 16:
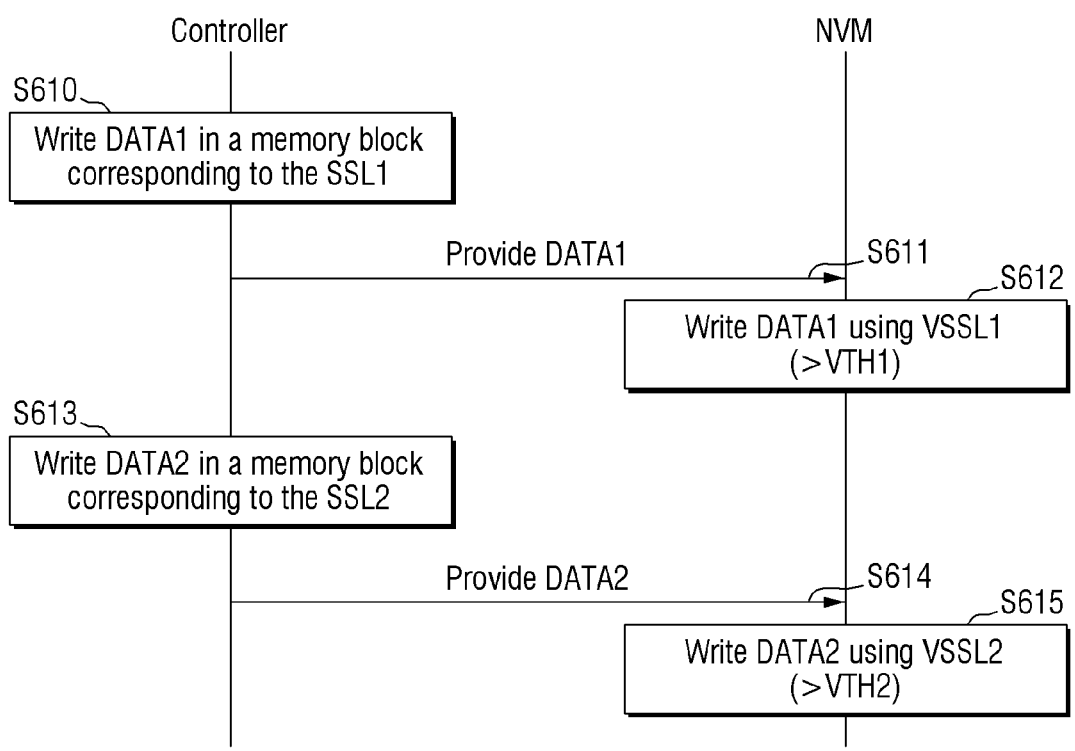
FIG. 16 is a flow diagram illustrating operation of a string selection transistor when data is written in accordance with embodiments of the inventive concept.
Figure 17:
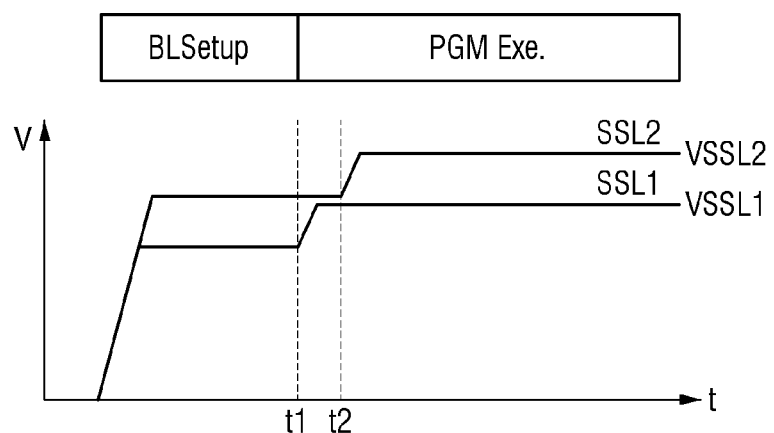
FIG. 17 is a graph illustrating a string selection line voltage when data is written in accordance with embodiments of the inventive concept.

FIG. 16 is a flow diagram illustrating operation of a string selection transistor when data is written in accordance with embodiments of the inventive concept, and FIG. 17 is a time/voltage graph illustrating a string selection line voltage when data is written in accordance with embodiments of the inventive concept.

Referring to FIG. 16, the storage controller 200 may write first data DATA1 in a memory block corresponding to the first string selection line SSL1 (S610). Therefore, the storage controller 200 may provide the first data DATA1 to the nonvolatile memory 400 (S611). Subsequently, the nonvolatile memory 400 may write the first data DATA1 using a first string selection line voltage VSSL1 (S612). In this case, the first string selection line voltage VSSL1 may be greater than the first threshold voltage VTH1. That is, the first string selection line voltage VSSL1 may be applied to the first string selection line SSL1. Therefore, the first data DATA1 may be written in the memory block connected to the first string selection line SSL1.

The storage controller 200 may write second data DATA2 in a memory block corresponding to the second string selection line SSL2 (S613). Therefore, the storage controller 200 may provide the second data DATA2 to the nonvolatile memory 400 (S614). The nonvolatile memory 400 may write the second data DATA2 using a second string selection line voltage VSSL2 (S615). In this case, the second string selection line voltage VSSL2 may be greater than the second threshold voltage VTH2. That is, the second string selection line voltage VSSL2 may be applied to the second string selection line SSL2. Therefore, the second data DATA2 may be written in the memory block connected to the second string selection line SSL2.

Referring to FIG. 17, a time period during which a write operation is performed may include a time period at which the bit line is set up and a program execution time period. The first string selection line voltage VSSL1 may be maintained at a low level before a first time t1, and may be maintained at a high level after the first time t1. The second string selection line voltage VSSL2 may be maintained at a low level before a second time t2, and may be maintained at a high level after the second time t2. That is, the time period during which the second string selection line voltage VSSL2 is applied may be greater than the time period during which the first string selection line voltage VSSL1 is applied. In some embodiments, a level of the second string selection line voltage VSSL2 may be greater than that of the first string selection line voltage VSSL1.

Figure 18:
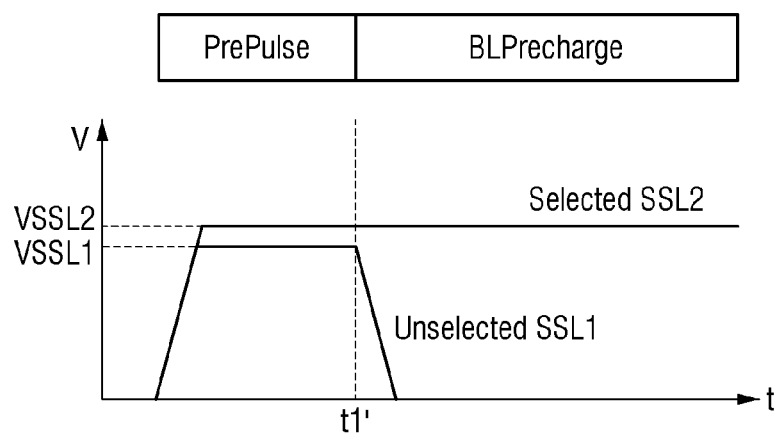
FIGS. 18 and 19 are respective graphs illustrating a string selection line voltage when data is read in accordance with embodiments of the inventive concept.
Figure 19:
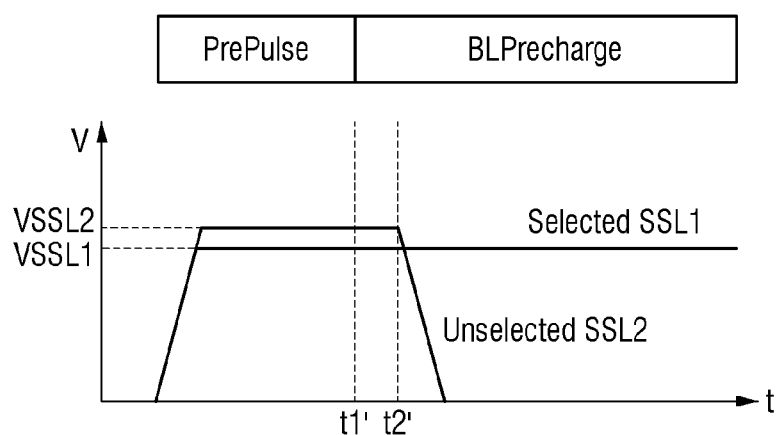

FIGS. 18 and 19 are respective graphs illustrating a string selection line voltage when other data is read in accordance with embodiments of the inventive concept.

Referring to FIG. 18, the read operation may include a pre-pulse operation and a bit line precharge operation. Before data is read from the memory cell array 410, the first string selection line voltage VSSL1 may be applied to gates of the string selection transistors SST11 to SST14 of the first memory cell array MCA1, and the second string selection line voltage VSSL2 may be applied to gates of the string selection transistors SST21 to SST24 of the second memory cell array MCA2. In this case, the level of the second string selection line voltage VSSL2 may be greater than that of the first string selection line voltage VSSL1.

The second string selection line voltage VSSL2 applied to the selected second string selection line SSL2 may be maintained after a first time t1', and the first string selection line voltage VSSL1 applied to the unselected first string selection line SSL1 may be 0V without being maintained after the first time t1'.

Referring to FIG. 19, the first string selection line voltage VSSL1 applied to the selected first string selection line SSL1 may be maintained after the first time t1'. The second string selection line voltage VSSL2 applied to the unselected second string selection line SSL2 may be 0V without being maintained after a second time t2'. In this case, the second time t2' may be subsequent to the first time t1'. That is, the time period at which the second string selection line voltage VSSL2 is applied may be greater than the time period at which the first string selection line voltage VSSL1 is applied, but the embodiments of the inventive concept are not limited thereto.

Figure 20:
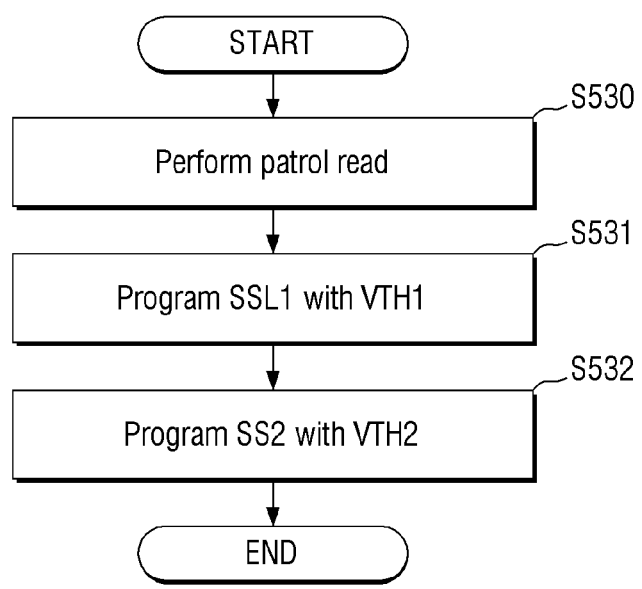
FIG. 20 is a flow chart illustrating a reclaiming method for a string selection transistor during a patrol read operation in accordance with embodiments of the inventive concept.

FIG. 20 is a flow chart illustrating a reclaiming method for a string selection transistor during a patrol read operation in accordance with embodiments of the inventive concept.

Referring to FIG. 20, the storage controller 200 may perform a patrol read operation (S530). The storage controller 200 may verify retention of memory cells included in the memory cell array 410 of the nonvolatile memory 400. When the retention of the memory cell is verified, the storage controller 200 may perform a reclaim for the memory cell.

When the storage controller 200 performs reclaim for the string selection transistors SST11 to SST14 connected to the first string selection line SSL1, the storage controller 200 may program the first string selection line SSL1 with the first threshold voltage VTH1 (S531). Also, when the storage controller 200 performs reclaim for the string selection transistors SST21 to SST24 connected to the second string selection line SSL2, the storage controller 200 may program the second string selection line SSL2 with the second threshold voltage VTH2 (S532). In this case, the level of the second threshold voltage VTH2 may be greater than that of the first threshold voltage VTH1. That is, the first string selection line SSL1 and the second string selection line SSL2 may be programmed with different threshold voltages even when reclaim is performed therefor.

Hereinafter, the memory cell array (like the memory cell array 410 of FIG. 2) according to embodiments of the inventive concept will be described with reference to FIGS. 21 and 22. Here, FIG. 21 is a plan view of the memory cell array and FIG. 22 is a scatter diagram illustrating a threshold voltage for a string selection transistor of the memory cell array of FIG. 21.

Figure 21:
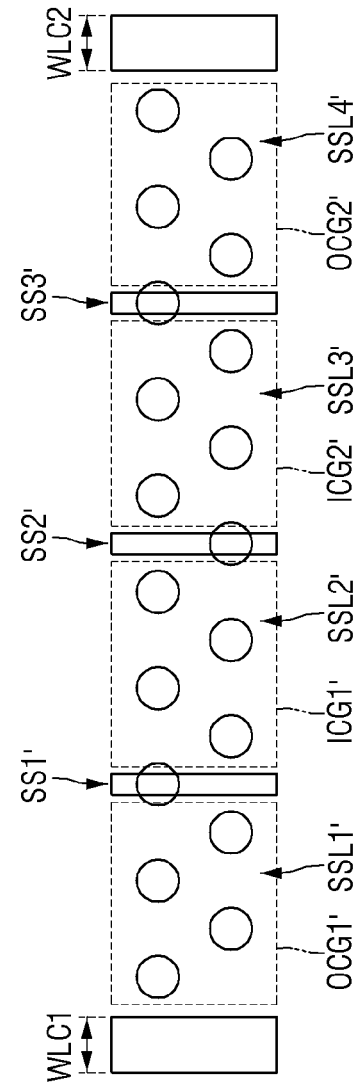
FIG. 21 is a plan view of a memory cell array according to embodiments of the inventive concept.
Figure 22:
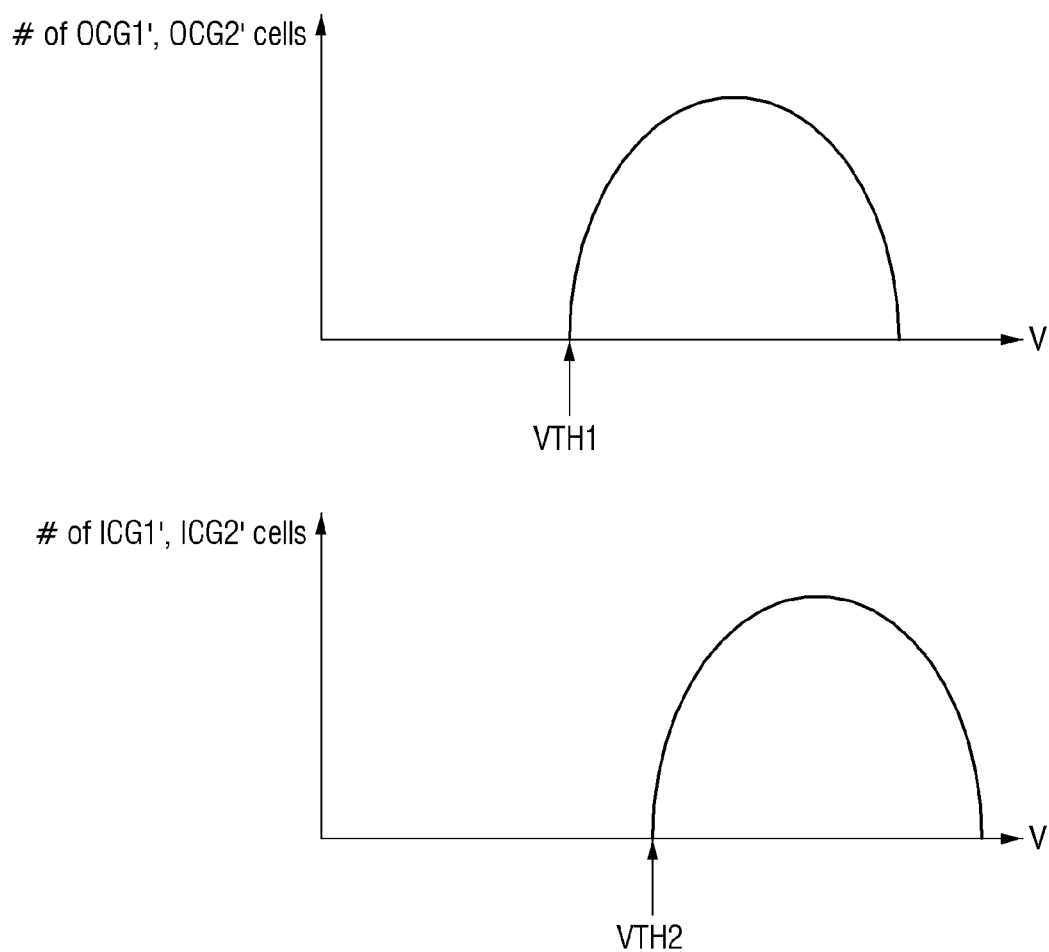
FIG. 22 is a scatter diagram illustrating a threshold voltage for a string selection transistor of the memory cell array of FIG. 21.

Referring to FIG. 21, the memory cell array may include a first string selection line SSL1', a second string selection line SSL2', a third string selection line SSL3' and a fourth string selection line SSL4', which are disposed between the first word line cutting area WLC1 and the second word line cutting area WLC2. The first string selection line SSL1' and the second string selection line SSL2' may be spaced apart by a first cutting line SS1'. The second string selection line SSL2' and the third string selection line SSL3' may be spaced apart by a second cutting line SS2'. The third string selection line SSL3' and the fourth string selection line SSL4' may be spaced apart by a third cutting line SS3'.

The plurality of channel structures may be arranged between the first word line cutting area WLC1 and the second word line cutting area WLC2. In this case, the memory cell array may include nineteen (19) channel structures, as an example.

A first outer channel structure group OCG1' may be disposed to be close to the first word line cutting area WLC1. The first outer channel structure group OCG1' may include channel structures that pass through the first string selection line SSL1'. A second outer channel structure group OCG2' may be disposed to be close to the second word line cutting area WLC2. The second outer channel structure group OCG2' may include channel structures that pass through the fourth string selection line SSL4'.

A first inner channel structure group ICG1' may be disposed to be close to the first outer channel structure group OCG1'. The first inner channel structure group ICG1' may include channel structures that pass through the second string selection line SSL2'. The second inner channel structure group ICG2' may be disposed to be close to the second outer channel structure group OCG2'. The second inner channel structure group ICG2' may include channel structures that pass through the third string selection line SSL3'.

That is, the first to fourth string selection lines SSL1' to SSL4' may be sequentially arranged between the first and second word line cutting areas WLC1 and WLC2.

Referring to FIG. 22, string selection transistors of the first and second outer channel structure groups OCG1' and OCG2' may have a first threshold voltage VTH1. String selection transistors of the first and second inner channel structure groups ICG1' and ICG2' may have a second threshold voltage VTH2. In this case, the level of the second threshold voltage VTH2 may be greater than that of the first threshold voltage VTH1. Therefore, the nonvolatile memory 400 having nineteen (19) holes may also provide improved performance.

Hereinafter, a memory cell array (like the memory cell array 410 of FIG. 2) according to embodiments of the inventive concept will be described with reference to FIGS. 23 and 24. Here, FIG. 23 is a plan view of the memory cell array, and FIG. 24 is a scatter diagram illustrating a threshold voltage for a string selection transistor of the memory cell array of FIG. 23.

Figure 23:
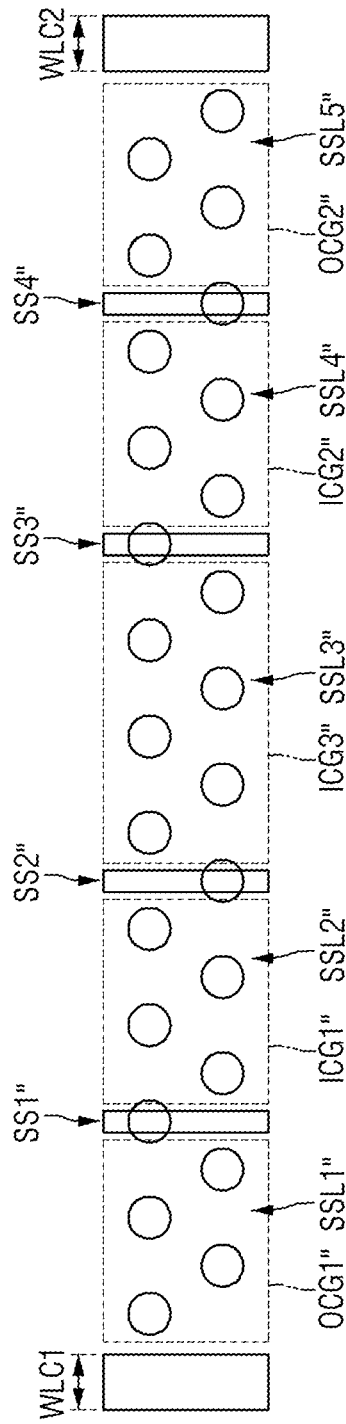
FIG. 23 is a plan view of a memory cell array according to embodiments of the inventive concept.
Figure 24:
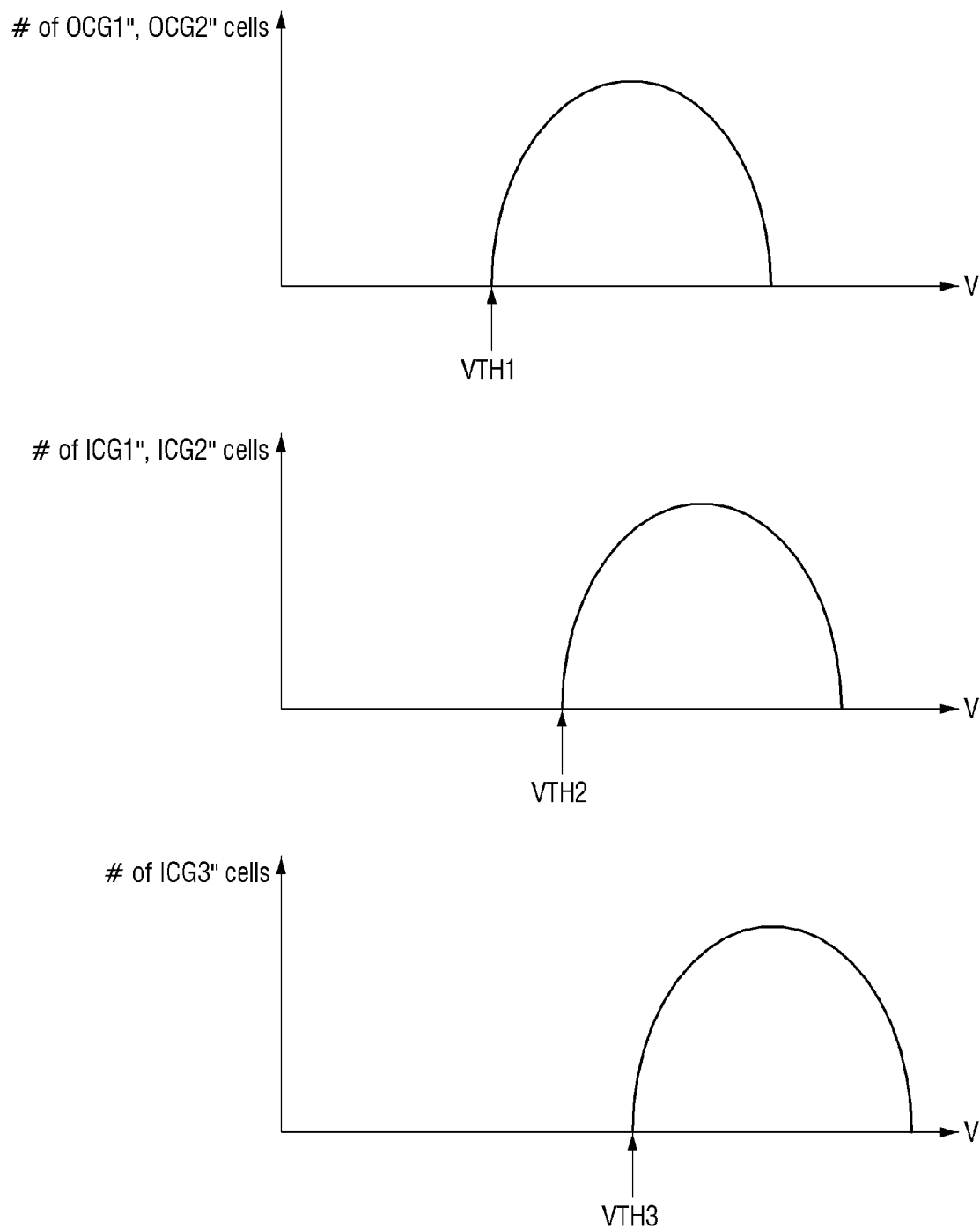
FIG. 24 is a scatter diagram illustrating a threshold voltage for a string selection transistor of the memory cell array of FIG. 23.

Referring to FIG. 23, the memory cell array include a first string selection line SSL1", a second string selection line SSL2", a third string selection line SSL3", a fourth string selection line SSL4", and a fifth string selection line SSL5", which are disposed between the first word line cutting area WLC1 and the second word line cutting area WLC2. The first string selection line SSL1" and the second string selection line SSL2" may be spaced apart by a first cutting line SS1". The second string selection line SSL2" and the third string selection line SSL3" may be spaced apart by a second cutting line SS2". The third string selection line SSL3" and the fourth string selection line SSL4" may be spaced apart by a third cutting line SS3". The fourth string selection line SSL4" and the fifth string selection line SSL5" may be spaced apart by a fourth cut line SS4".

The plurality of channel structures may be arranged between the first word line cutting area WLC1 and the second word line cutting area WLC2. In this case, the memory cell array may include twenty-four (24) channel structures, as an example.

A first outer channel structure group OCG1" may be disposed to be close to the first word line cutting area WLC1. The first outer channel structure group OCG1" may include channel structures that pass through the first string selection line SSL1". A second outer channel structure group OCG2" may be disposed to be close to the second word line cutting area WLC2. The second outer channel structure group OCG2" may include channel structures that pass through the fourth string selection line SSL4".

A first inner channel structure group ICG1" may be disposed between the first outer channel structure group OCG1" and the third inner channel structure group ICCG3". The first inner channel structure group ICG1" may include channel structures that pass through the second string selection line SSL2". A second inner channel structure group ICG2" may be disposed between the second outer channel structure group OCG2" and the third inner channel structure group ICCG3". The second inner channel structure group ICG2" may include channel structures that pass through the fourth string selection line SSL4". A third inner channel structure group ICCG3" may be disposed between the first and second inner channel structure groups ICG1" and ICG2". The third inner channel structure group ICCG3" may include channel structures that pass through the third string selection line SSL3".

A distance from the first word line cutting area WLC1 or the second word line cutting area WLC2 to the second and fourth string selection lines SSL2" and SSL4" may be greater than a distance from the first word line cutting area WLC1 or the second word line cutting area WLC2 to the first and fifth string selection lines SSL1" and SSL5". In addition, a distance from the first word line cutting area WLC1 or the second word line cutting area WLC2 to the third string selection line SSL3" may be greater than a distance from the first word line cutting area WLC1 or the second word line cutting area WLC2 to the second and fourth string selection lines SSL2" and SSL4".

Referring to FIG. 22, string selection transistors of the first and second outer channel structure groups OCG1" and OCG2" may have a first threshold voltage VTH1. String selection transistors of the first and second inner channel structure groups ICG1" and ICG2" may have a second threshold voltage VTH2. In this case, the level of the second threshold voltage VTH2 may be greater than that of the first threshold voltage VTH1. In addition, a string selection transistor of the third inner channel structure group ICCG3" may have a third threshold voltage VTH3. The level of the third threshold voltage VTH3 may be greater than that of the first and second threshold voltages VTH1 and VTH2. Therefore, the nonvolatile memory 400 having twenty-four (24) holes may also provide improved performance.

Although the inventive concept have been described with reference to certain illustrated embodiments, it will be apparent to those skilled in the art that the inventive concept can be manufactured in various forms without being limited to the above-described embodiments and can be embodied in other specific forms without departing from the scope of the inventive concept, as defined by the following claims.

What is claimed is:
1. A nonvolatile memory comprising:
a first memory cell array including a first selection transistor connected to a first string selection line;
a second memory cell array including a second selection transistor connected to a second string selection line and spaced apart from the first string selection line by a first cutting line; and
a peripheral circuit configured to;
provide a first program voltage to the first selection transistor,
provide a second program voltage to the second selection transistor different from the first program voltage, program the first selection transistor with a first threshold voltage in response to the first program voltage, and
program the second selection transistor with a second threshold voltage level greater than the first threshold voltage in response to the second program voltage.

2. The nonvolatile memory of claim 1, further comprising:
a third memory cell array including a third selection transistor connected to a third string selection line and spaced apart from the second string selection line by a second cutting line, wherein the peripheral circuit is further configured to provide a third program voltage to the third selection transistor.

3. The nonvolatile memory of claim 2, wherein the peripheral circuit is further configured to program the third selection transistor with a third threshold voltage having a level less than the second threshold voltage in response to the third program voltage.

4. The nonvolatile memory of claim 2, wherein the peripheral circuit is further configured to program the third selection transistor with a third threshold voltage having the same level as the second threshold voltage in response to the third program voltage.

5. The nonvolatile memory of claim 4, further comprising:
a fourth memory cell array including a fourth selection transistor connected to a fourth string selection line and spaced apart from the third string selection line by a third cutting line, wherein the peripheral circuit is further configured to provide a fourth program voltage to the fourth selection transistor and program the fourth selection transistor with a fourth threshold voltage level less than the third threshold voltage in response to the fourth program voltage.

6. The nonvolatile memory of claim 2, wherein the peripheral circuit is further configured to program the third selection transistor with a third threshold voltage having a level greater than the second threshold voltage in response to the third program voltage.

7. The nonvolatile memory of claim 6, further comprising:
a fourth memory cell array including a fourth selection transistor connected to a fourth string selection line and spaced apart from the third string selection line by a third cutting line; and
a fifth memory cell array including a fifth selection transistor connected to a fifth string selection line and spaced apart from the fourth string selection line by a fourth cutting line, wherein the peripheral circuit is further configured to;
provide a fourth program voltage to the fourth selection transistor,
provide a fifth program voltage to the fifth selection transistor,
program the fourth selection transistor with a fourth threshold voltage less than the third threshold voltage in response to the fourth program voltage, and
program the fifth selection transistor with a fifth threshold voltage less than the fourth threshold voltage in response to the fifth program voltage.

8. The nonvolatile memory of claim 1, wherein the first memory cell array is configured to turn ON the first selection transistor in response to a first string selection line voltage greater than the first threshold voltage,
the second memory cell array is configured to turn ON the second selection transistor in response to a second string selection line voltage greater than the second threshold voltage, and
the second string selection line voltage is greater than the first string selection line voltage.

9. The nonvolatile memory of claim 8, wherein a time period during which the second string selection line voltage is applied is greater than a time period during which the first string selection line voltage is applied.

10. The nonvolatile memory of claim 1, wherein the peripheral circuit is further configured to program the first selection transistor with the first threshold voltage when the first selection transistor is degraded, and program the second selection transistor with the second threshold voltage when the second selection transistor is degraded.

11. A nonvolatile memory comprising:
a substrate including a first string selection line and a second string selection line spaced apart from the first string selection line by a first cutting line;
a first word line cutting area in the substrate and extending in a first direction;
a first channel structure passing through the first string selection line; and
a second channel structure passing through the second string selection line,
wherein the first string selection line is spaced apart in a second direction from the first word line cutting area by a first distance,
the second string selection line is spaced apart in the second direction from the first word line cutting area by a second distance greater than the first distance, and
a first threshold voltage of the first string selection line is different from a second threshold voltage of the second string selection line.

12. The nonvolatile memory of claim 11, wherein the second threshold voltage is greater than the first threshold voltage.

13. The nonvolatile memory of claim 12, wherein a first driving voltage applied to the first string selection line is greater than the first threshold voltage,
a second driving voltage applied to the second string selection line is greater than the second threshold voltage, and
the second driving voltage is greater than the first driving voltage.

14. The nonvolatile memory of claim 11, further comprising:
a third channel structure passing through the first string selection line and spaced apart from the first channel structure; and
a fourth channel structure passing through the second string selection line and spaced apart from the second channel structure.

15. The nonvolatile memory of claim 11, wherein the first string selection line and the second string selection line are spaced apart in the second direction.

16. The nonvolatile memory of claim 11, wherein the second threshold voltage is less than the first threshold voltage.

17. The nonvolatile memory of claim 11, wherein the substrate further includes a third string selection line spaced apart from the second string selection line by a second cutting line,
the third string selection line is spaced apart in the second direction from the first word line cutting area by a third distance greater than the second distance, and a third threshold voltage of the third string selection line is different from the second threshold voltage.

18. The nonvolatile memory of claim 17, wherein the substrate further includes a fourth string selection line spaced apart from the third string selection line by a third cutting line, the fourth string selection line is spaced apart in the second direction from the first word line cutting area by a fourth distance greater than the third distance, and a fourth threshold voltage of the fourth string selection line is different from the third threshold voltage.

19. The nonvolatile memory of claim 18, wherein the substrate further includes a fifth string selection line spaced apart from the fourth string selection line by a fourth cutting line, the fifth string selection line is spaced apart in the second direction from the first word line cutting area by a fifth distance greater than the fourth distance, and a fifth threshold voltage of the fifth string selection line is different from the fourth threshold voltage.

20. A storage device comprising:

a controller; and a nonvolatile memory controlled by the controller, wherein the nonvolatile memory includes a first memory block including a first selection transistor connected to a first string selection line and a second memory block including a second selection transistor connected to a second string selection line and spaced apart from the first string selection line by a first cutting line, the controller is configured to provide a first program command and a second program command different from the first program command to the nonvolatile memory, the nonvolatile memory is configured to program the first selection transistor with a first threshold voltage in response to the first program command, and program the second selection transistor with a second threshold voltage different from the first threshold voltage in response to the second program command, the controller is further configured to provide a first read command and a second read command different from the first read command to the nonvolatile memory, and the nonvolatile memory is further configured to read first data using a first string selection voltage greater than the first threshold voltage in response to the first read command, and read second data using a second string selection voltage greater than the second threshold voltage in response to the second read command.

* * * * *